US008334222B2

(12) United States Patent
Gotou et al.

(10) Patent No.: US 8,334,222 B2
(45) Date of Patent: Dec. 18, 2012

(54) SEMICONDUCTOR WAFER PROCESSING METHOD AND APPARATUS

(75) Inventors: Isamu Gotou, Nagasaki (JP); Tomonori Kawasaki, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 97 days.

(21) Appl. No.: 12/434,276

(22) Filed: May 1, 2009

(65) Prior Publication Data

US 2009/0275213 A1 Nov. 5, 2009

(30) Foreign Application Priority Data

May 2, 2008 (JP) .................................. 2008-120746

(51) Int. Cl.
*H01L 21/469* (2006.01)
(52) U.S. Cl. ........ 438/782; 438/770; 438/778; 438/787; 438/974; 438/976; 257/E21.001
(58) Field of Classification Search ........... 257/E21.001; 438/759, 778, 782, 787, 974, 976; 216/57, 216/79
See application file for complete search history.

(56) References Cited

U.S. PATENT DOCUMENTS

| | | | |
|---|---|---|---|
| 4,749,440 A * | 6/1988 | Blackwood et al. ......... | 438/706 |
| 5,714,203 A | 2/1998 | Schellenberger et al. | |
| 5,727,578 A * | 3/1998 | Matthews ...................... | 134/61 |
| 5,896,875 A * | 4/1999 | Yoneda ....................... | 134/102.3 |
| 6,395,647 B1 * | 5/2002 | Li et al. ......................... | 438/758 |
| 2002/0108641 A1 * | 8/2002 | Lee et al. ....................... | 134/30 |
| 2004/0069321 A1 | 4/2004 | Maleville et al. | |
| 2004/0103915 A1 * | 6/2004 | Verhaverbeke et al. ....... | 134/1.3 |
| 2005/0215063 A1 | 9/2005 | Bergman | |
| 2008/0308122 A1 | 12/2008 | Schwab et al. | |

FOREIGN PATENT DOCUMENTS

| | | |
|---|---|---|
| DE | 10 2007 027112 A | 12/2008 |
| JP | 10-064870 | 3/1998 |
| JP | 2001-053050 | 2/2001 |
| JP | 2002-305175 | 10/2002 |
| JP | 2003-059879 | 2/2003 |
| JP | 2005-191143 | 7/2005 |
| JP | 2006-019523 | 1/2006 |

OTHER PUBLICATIONS

Extended European Search Report of corresponding European Application No. 09159146.1-1235 dated Jun. 14, 2011.
Japan Patent Office, Notification of Reasons for Refusal for Application No. 2008-120746, aug. 29, 2012, 5 pages, Japan.

* cited by examiner

*Primary Examiner* — Robert Huber
(74) *Attorney, Agent, or Firm* — Alston & Bird LLP

(57) ABSTRACT

A processing method of a semiconductor wafer is provided. The method comprising the steps of: removing at least part of oxide film from a surface of the semiconductor wafer; removing liquid from the surface; and providing at least partial oxide film on the surface by applying an oxidizing gas wherein a gas flow of the oxidizing gas and/or an ambient gas involved by the oxidizing gas is characterized by an unsaturated vapor pressure of the liquid such that the liquid on the surface vaporizes. The above-described steps are conducted in this order.

6 Claims, 16 Drawing Sheets

Fig. 10
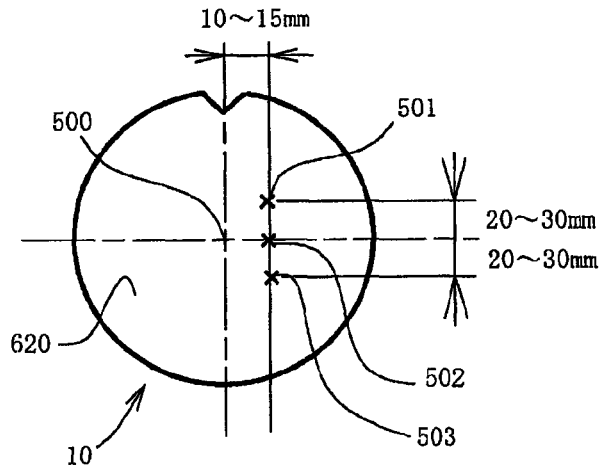
Fig. 11A
|  | Diameter (mm) | Power (W) | Rotation speed (rpm) | Torque (Nm) | Weight (kg) |
|---|---|---|---|---|---|
| Example | 450 | 500 | 500 | 9.00 | 8 |
| Comparative example | 200 | 1500 | 3000 | 4.78 | 9 |
|  | 300 | 2000 | 3000 | 6.37 | 12 |
|  | 450 | 3500 | 3000 | 11.10 | 19 |
Fig. 11B
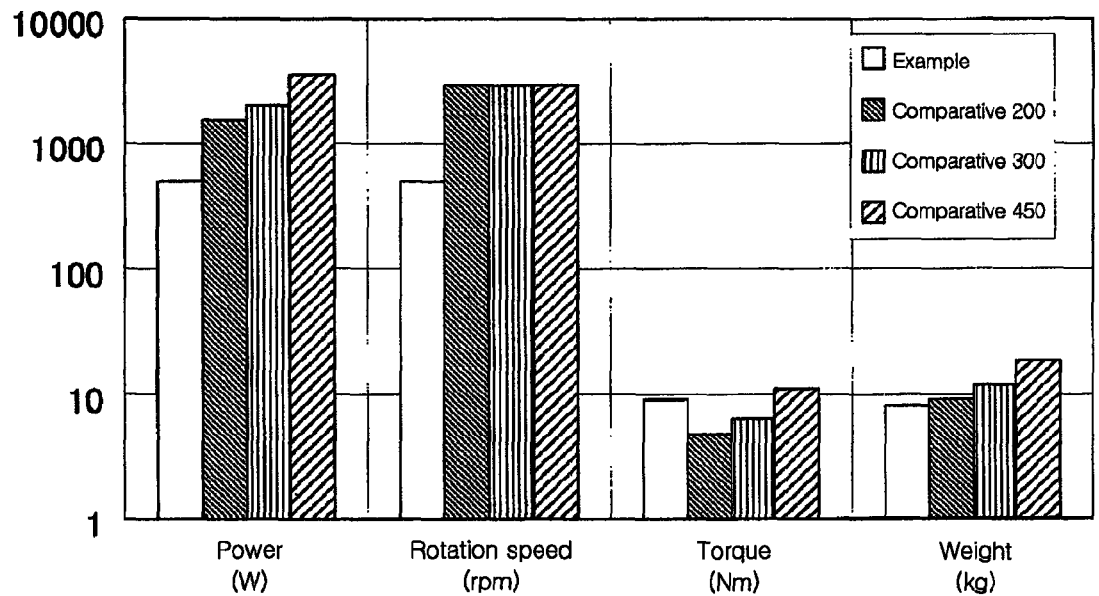

-- Prior Art --

SEMICONDUCTOR WAFER PROCESSING METHOD AND APPARATUS

CROSS REFERENCE TO RELATED APPLICATIONS

This application claims priority to Japanese Patent Application No. 2008-120746 filed on May 2, 2008, the contents of which are incorporated by reference.

FIELD OF THE INVENTION

The present invention relates to a surface cleaning, drying, or other surface processing method and processing apparatus of a semiconductor wafer, and more specifically relates to a method for performing processing according to a surface state of the semiconductor wafer and an apparatus for carrying out the present method.

BACKGROUND ART

A semiconductor wafer is material for semiconductor devices, and there are various requirements in physical properties and compositions as well as in shape, surface roughness, surface chemical properties, defect density, etc. Therefore, surface polishing and other types of processing are performed after slicing a single crystalline ingot. Abrasion dust, contaminants, debris, etc. may be generated in various types of processing and appropriate cleaning is desired. Meanwhile, a semiconductor wafer that is shipped out as a product is desired to have a comparatively stable surface, which would not be changed in its properties even after being exposed to the general air atmosphere. Especially in consideration of transportation, a wafer in a wet state is not desirable and it is rather desirable to dry the wafer for shipment.

In recent years, quality requirements for the semiconductor wafer are high such that a single wafer type is rather preferred to a batch type, and a spin dry process is adopted, in which the semiconductor wafer is rotated at a high speed for drying after the semiconductor wafer is variously processed on the surface in a wet state.

Meanwhile, since the circumferential velocity becomes very high as the diameter of the semiconductor wafer has generally been made larger in recent years, it is concerned that the properties of the semiconductor wafer may be affected. FIG. 17 is a flowchart showing a surface processing method of a silicon wafer as an example of the semiconductor wafer. The processing is largely divided into three sections. The first one is what is herein called main processing. Then, the next is final processing, in which a wet state is converted into a dry state, and shipment processing for shipping the product follows. Processing actions of the respective steps are briefly described inside the boxes on the left-hand side of the flow. Surface states of the semiconductor wafer in the corresponding steps are briefly described inside the boxes on the right-hand side.

Specifically, first, the semiconductor wafer is processed with aqueous hydrofluoric acid or hydrogen fluoride gas to remove an oxide film on the surface (S2). Since the underlying metal silicon appears on the surface in this process, the surface is put in a water-repellent state such that the surface is not wettable and dropped water is formed in a spherical shape on the surface even when the water is put in contact (S2). The surface is then oxidized by ozone water and the surface is made hydrophilic (S4).

In this state, contaminants or the like may be left on the surface such that the oxide film on the surface is further removed by aqueous hydrofluoric acid or hydrogen fluoride gas (S110). In this process, the surface of the semiconductor wafer is changed to a water-repellent state as mentioned above (S110). Then, using ozone water again, a hydrophilic film is formed on the surface of the semiconductor wafer so as to make the surface hydrophilic (S1070). The surface of the semiconductor wafer can thereby be cleaned without leaving contaminants or impurities that were contained in the aqueous hydrofluoric acid and the like on the surface. Next, to remove the contaminants in the ozone water, cleaning by ultrapure water is performed, and the surface is hydrophilic during this process as well (S1080). Since the wafer in this state cannot be shipped as is, in most cases, the liquid on the surface of the semiconductor wafer is scattered by spin drying to dry the semiconductor wafer surface (S1090).

A method is disclosed in JP-A-2002-305175, in which a cleaning gas (for example, ozone or hydrogen fluoride) is injected on the wafer formed with a water membrane such that a small chamber is formed and much gas is dissolved in the membrane, and the wafer is cleaned by using the cleaning solution having a high solubility. Then, a dry gas (for example, IPA) is furthermore supplied to dry the water film. Also, an invention is disclosed in JP application No. 2003-59879, in which a processing solution is brought into contact with a surface of a substrate W to form a liquid film and an ozone gas at a higher temperature than that of the processing solution is applied to the surface such that the surface of the substrate W is processed, thereby increasing a reaction rate of the substrate surface processing by ozone.

SUMMARY OF THE INVENTION

The present invention has been conceived under such background. According to one embodiment of the present invention, a processing method of a semiconductor wafer is provided. The method comprises: the steps of: removing at least part of oxide film from a surface of the semiconductor wafer; removing liquid from the surface; and providing at least partial oxide film on the surface by applying an oxidizing gas wherein a gas flow of the oxidizing gas and/or an ambient gas involved by the oxidizing gas is characterized by an unsaturated vapor pressure of the liquid such that the liquid on the surface vaporizes. The above-described steps are conducted in this order.

Further features of the present invention, its nature, and various advantages will be more apparent from the accompanying drawings and the following description of the preferred embodiment.

BRIEF DESCRIPTION OF THE DRAWINGS

FIG. 10 is a plan view of a wafer subject to a film formation level test showing measurement points on the wafer.

FIG. 11A is a diagram showing a table summarizing specifications of AC servomotors employed in a wafer processing device and a spin drying chamber.

FIG. 11B is a graph showing specifications of the AC servomotors of FIG. 11A in a comparative manner.

DETAILED DESCRIPTION OF THE PREFERRED EMBODIMENT

Although embodiments of the present invention shall now be described in detail with reference to the attached drawings, the following description is provided to describe the embodiments of the present invention, and the present invention is not limited to these embodiments. Elements of the same or similar kinds will be referred to by the same or related symbols and duplicated descriptions thereof will be omitted.

Figure 1A:
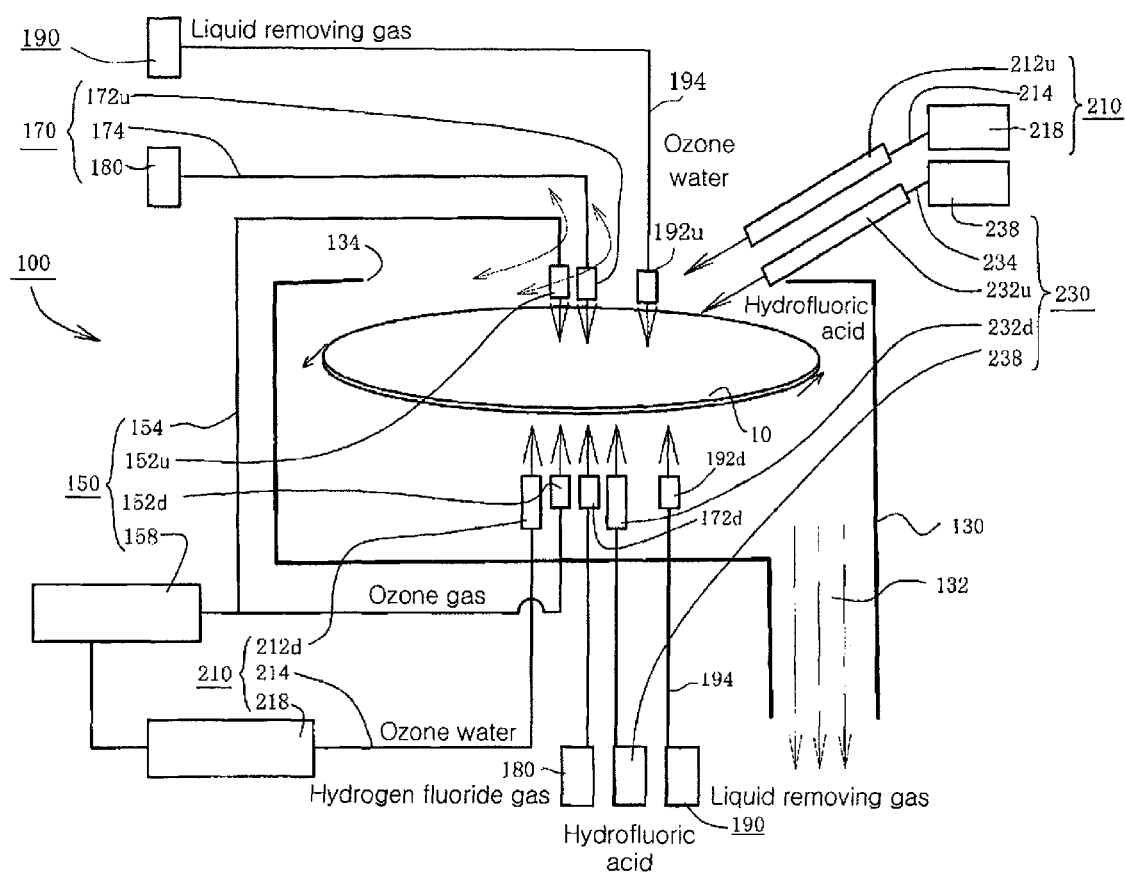
FIG. 1A is a schematic diagram showing a wafer processing apparatus according to Embodiment 1.

FIG. 1 is a schematic diagram of a wafer processing apparatus according to Embodiment 1 of the present invention.

The wafer processing apparatus 100 is a single wafer type of processing apparatus and mainly comprises a mounting member 110, to which a semiconductor wafer 10 (hereinafter referred to as "wafer") is fixed (see FIGS. 12A-12C), a chamber 130, in which the mounting member 110 is housed, and jetting devices 210, 230, 150, and 170 for jetting a processing liquid and/or a processing gas onto a surface of the wafer 10 to remove oxide films on the surface. The apparatus also may further comprise a gas jetting device (for example, a nitrogen gas jetting device) for jetting gas to remove the liquid from the surface if necessary.

The mounting member 110 (see FIG. 12A) is a member capable of holding the wafer 10 that is a circular and large-diameter wafer with an outer diameter of at least 300 mm. The mounting member 110 is fixed to and made rotatable by a rotating member (not shown) connected to a rotating shaft of a servomotor (not shown). A mounting member (not shown) is not limited to a form with which an edge portion (outer circumferential portion) of the wafer 10 is mechanically held by a plurality of mounting chucks (not shown) disposed at equal intervals along a circumferential distance, and may be of a form with which the wafer 10 is held by vacuum suction, etc. The mounting member is also not limited to a form that holds the wafer 10 in a horizontal orientation and may be of a form that supports the wafer 10 inclining or in a vertical direction. Details of the mounting member shall be described below.

The abovementioned jetting devices for jetting processing fluids comprise an ozone water jetting device 210 for jetting ozone water and an aqueous hydrofluoric acid jetting device 230 for jetting aqueous hydrofluoric acid (aqueous hydrofluoric acid solution), which are fastened by brackets (not shown), respectively. Here, the fluids may comprise: liquid and gas.

The ozone water jetting device 210 includes tubular nozzles 212$u$ and 212$d$, each of which is positioned above the wafer 10 and jets the ozone water obliquely downward from a hole of a small diameter, and distributing pipes 214 that feed the ozone water to the nozzles 212$u$ and 212$d$. The distributing pipes 214 are connected to ozone water supplying devices 218 via regulator valves (not shown) and a pump (not shown) for pressure feeding. In the present invention, shapes of the nozzles 212$u$ and 212$d$ are not limited to the tubular shape. The shapes of the nozzles will be described in detail later.

The jetting device 230 for jetting aqueous hydrofluoric acid includes nozzles 232$u$ and 232$d$, from which the aqueous hydrofluoric acid is jetted, and distributing pipes 234 that feed the aqueous hydrofluoric acid to the nozzles 232$u$ and 232$d$. The distributing pipes 234 are connected to an aqueous hydrofluoric acid supplying device 238 via regulator valves (not shown) and a pump (not shown) for pressure feeding. The nozzles 232$u$ and 232$d$ have a similar structure as the nozzles 212$u$ and 212$d$.

The gas jetting devices include a jetting device 150 for jetting ozone gas and a jetting device 170 for jetting hydrogen fluoride gas. As shall be described below, depending on processing details, the jetting device 170 for jetting hydrogen fluoride gas may be omitted from the wafer processing apparatus 100. In this case, processing is performed only by the jetting device 230 for jetting aqueous hydrofluoric acid.

The jetting device 150 for jetting ozone gas includes a nozzle 152$u$ positioned above the wafer 10, from which the ozone gas is jetted, a nozzle 152$d$ positioned below the wafer 10, from which the ozone gas is jetted, and gas pipes 154 that feed the ozone gas to the nozzles 152$u$ and 152$d$ and are connected via a regulator valve (not shown) to an ozone gas generating device 158 that supplies compressed ozone gas.

The nozzles 152u and 152d are held by holding members (not shown) that can move and change a moving direction with respect to the wafer 10.

The jetting device 170 for jetting hydrogen fluoride gas includes nozzles 172u and 172d, from which the hydrogen fluoride gas is jetted, and gas pipes 174 that feed the hydrogen fluoride gas. The gas pipes 174 are connected via regulator valves (not shown) to hydrogen fluoride gas generating devices 180 that supply compressed hydrogen fluoride gas. The nozzles 172u and 172d are installed in the same manner as the nozzles 152u and 152d. The hydrogen fluoride gas generating device 180 will be described below in detail.

The wafer processing apparatus 100 may include the jetting device 190 for jetting liquid removing gas as necessary. The jetting device 190 for jetting the liquid removing gas may include nozzles 192u and 192d, from which the liquid removing gas is jetted, and gas pipes 194 that feed the liquid removing gas. The gas pipes 194 are connected via regulator valves (not shown) to a liquid removing gas generating device (not shown) that supplies compressed liquid removing gas. The nozzles 192u and 192d are installed at similar positions in the wafer processing apparatus 100 in a same manner as the nozzles 172u, 172d, 152u, and 152d are installed.

The chamber 130 internally houses the mounting member with the wafer 10 placed thereon and provides a practically sealed space for performing respective surface processing method. The chamber 130 has an exhaust port 132 connected to a vacuum pump (not shown) and can thereby exhaust gases used in the respective processing method of the wafer 10.

Movable parts of the wafer processing apparatus 100, such as the jetting device 150 for jetting the ozone gas, the jetting device 210 for jetting the ozone water, the jetting device 230 for jetting the aqueous hydrofluoric acid, the rotational member of the mounting member, the exhaust port 132 provided in the chamber 130, etc., are connected to a controller (not shown) and configured in a controllable manner.

Figure 1B:
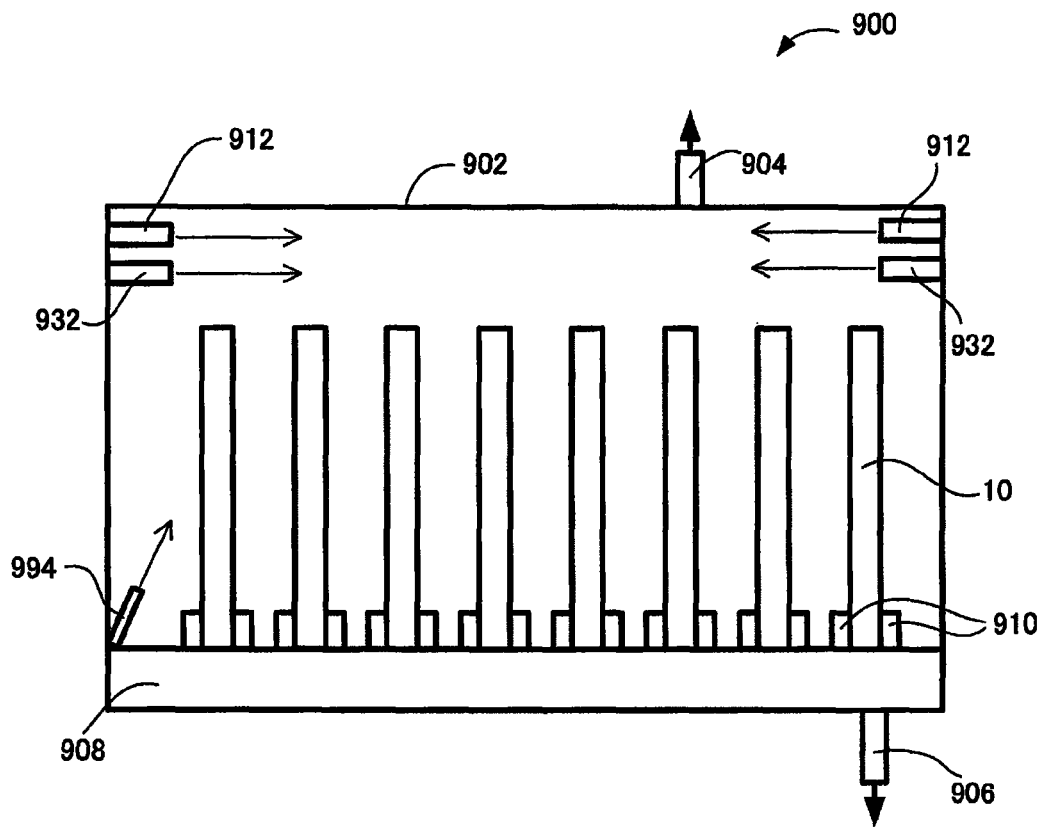
FIG. 1B is a schematic diagram showing a wafer processing apparatus according to Embodiment 7.

A wafer processing apparatus according to another embodiment (Embodiment 7) of the present invention shall now be described with reference to FIG. 1B. This semiconductor processing apparatus 900 is a batch type apparatus for cleaning a plurality of wafers 10 and mainly comprises a fixing member 910, by which the plurality of wafers are fixed; a chamber 902, in which the fixing members 910 are housed; and jetting devices for jetting a processing liquid and/or a processing gas onto a surface of the water 10 to remove oxide films from the surface. The apparatus also may further comprises a gas jetting device (for example, a nitrogen gas jetting device) 994 for jetting gas to remove the liquid on the surface if necessary. The chamber 902 has a vent 904 with a valve as a leak valve such that unnecessary inside pressure may be avoided. A drain 906 with a valve is provided at the bottom of the apparatus 900. The fixing member 910 may, for example, be a mounting member, on which the plurality of wafers can be placed and fixed horizontally, or a holding member, capable of holding and fixing the plurality of wafers in the vertical orientation. For example, a member similar to a rack in a dishwasher may be provided. The way to fix the wafers is not limited to the aforementioned, and another way to fix the wafers in a batch type wafer cleaning apparatus may be provided. Such a semiconductor processing apparatus may include, as a liquid removing means, a vibrating device 908 that applies vibration to the wafers and can thereby promote removal of water droplets, etc., from the surfaces of the wafers.

An operation example of the wafer processing apparatus 100 shall now be described. First, the wafer 10 is put into the chamber 130 from an entrance opening 134 and placed on the mounting member. The nozzles 152u and 152d of the jetting device 150 for jetting the ozone water are moved to predetermined positions both above and below the wafer 10 placed on the mounting member. The ozone water is jetted for a predetermined period of time at a predetermined flow rate (0.1 to 20 L/minute) from the nozzles 152u and 152d. The nozzles 152u and 152d are swung according to a predetermined movement and, if necessary, the rotational member of the mounting member is rotated at a predetermined rotation speed (for example, not exceeding 300 rpm) so that the ozone water is jetted uniformly on the wafer 10 in this process. The surface of the wafer 10 is processed by jetting a processing fluid such as aqueous hydrofluoric acid, etc., and a processing gas such as ozone gas, etc., onto the wafer 10 in a similar manner according to a respective predetermined sequence or as a mixed chemical solution or gas.

Figure 2:
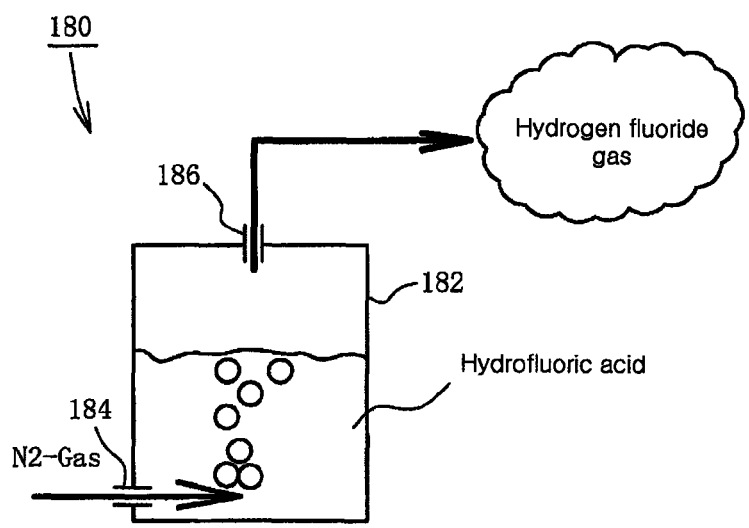
FIG. 2 is a conceptual diagram showing a device which generates hydrogen fluoride gas.

FIG. 2 is a schematic diagram of the hydrogen fluoride gas generating device. The hydrogen fluoride gas generating device 180 comprises a container 182 that contains aqueous hydrofluoric acid; a tube 184 that is connected to a lower portion of a side surface of the container 182 for blowing in nitrogen gas (N2-Gas); and a tube 186 disposed on a top portion of the container 182 for feeding out the generated hydrogen fluoride gas. With the hydrogen fluoride gas generating device 180, by the nitrogen gas being blown in from the tube 184 and bubbled through the aqueous hydrofluoric acid stored in the container 182, the hydrogen fluoride gas is generated to contain some amount of water vapor. In the following, processing method will be described in detail with a single crystal silicon wafer (hereinafter referred to simply as "wafer") as a specific example of the wafer 10.

Embodiment 1

Processing

Figure 3:
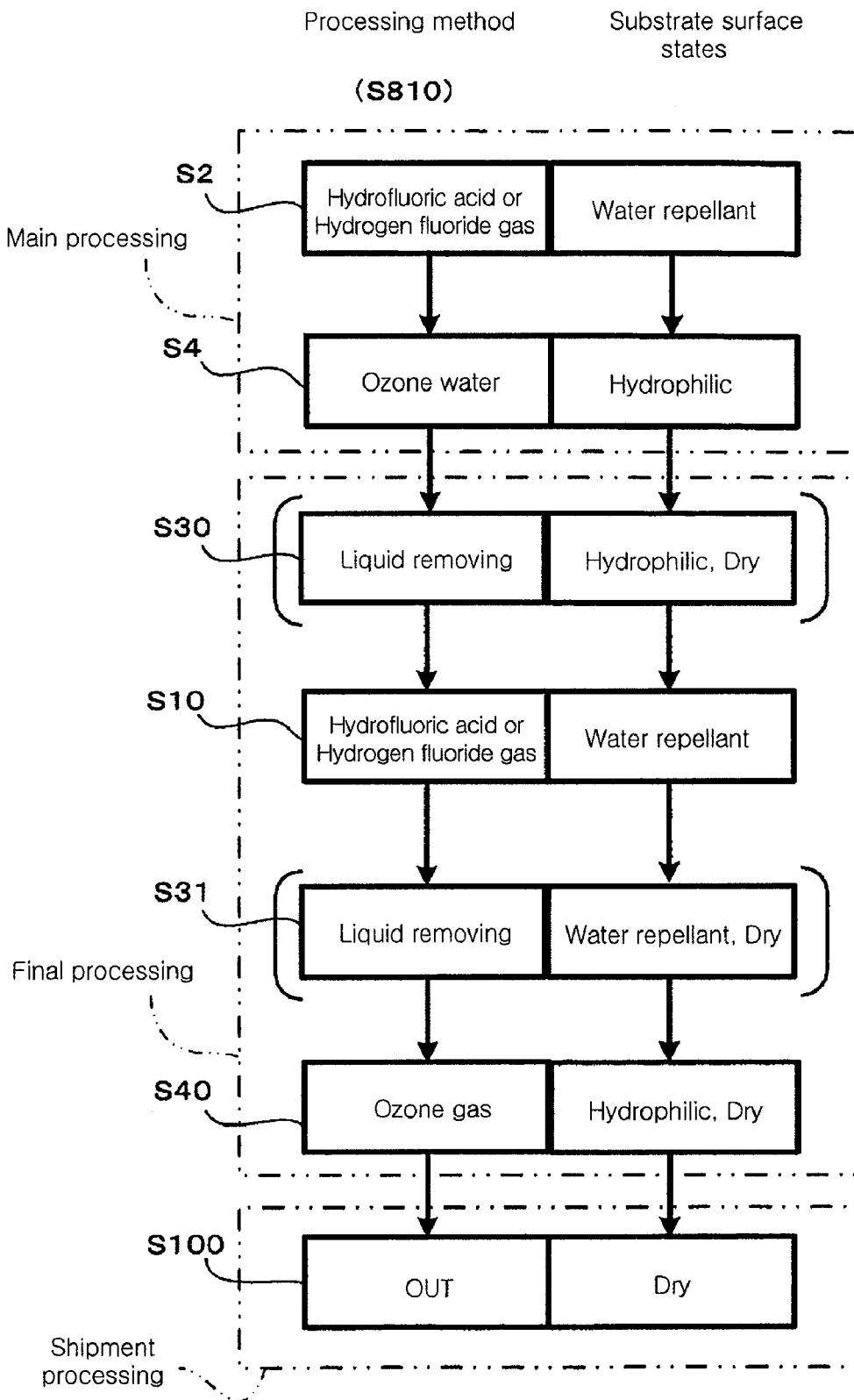
FIG. 3 shows a main flowchart of a processing method of the wafer according to Embodiment 1 of the present invention.

FIG. 3 shows a flowchart of a processing method of the wafer 10 according to Embodiment 1 of the present invention. This processing method (S810) is constituted of a main processing (S2, S4), a final processing (S10, S40), which is a processing method, and a shipment processing (S100). Also if necessary, the final processing may include a liquid removing step (S30, S31). Here, the liquid removing step may include a water removing step. In the present embodiment, because aqueous hydrofluoric acid and other liquids containing water are used, this step shall be referred to as a water removing step. In FIG. 3, processing method is indicated in a left column, and substrate surface states are described in a right column. The substrate surface state indicates a property that the surface (either or both a front surface and a rear surface) of the wafer 10 is made to exhibit by the processing method in the left column. The steps are now described as follows.

As mentioned above, the wafer 10 is put into the chamber 130 from the entrance opening 134 and placed on the mounting member. Upon confirming that the wafer 10 is fixed adequately, aqueous hydrofluoric acid is jetted from the nozzles 232u and 232d or hydrogen fluoride gas is jetted from the nozzles 172u and 172d onto the wafer 10 (S2). In this process, the wafer 10 is rotated at a comparatively low speed (for example, 200 rpm) so that the aqueous hydrofluoric acid or the hydrogen fluoride gas becomes distributed uniformly across the surface. An oxide film on the surface of the wafer 10 is dissolved and removed by either or both of the aqueous hydrofluoric acid and the hydrogen fluoride gas and the surface is converted into a water-repellent state such that the water is repelled even when, for example, pure water is contacted with the surface (S2). Ozone water is then jetted from the nozzles 212u and 212d onto the wafer 10 surface (S4). In this process, the wafer 10 is likewise rotated at a comparatively low speed (for example, 200 rpm) so that the ozone water becomes distributed uniformly across the surface. By this processing, the silicon at the surface is oxidized to form an oxide film and is put in a hydrophilic state (S4).

Because as mentioned above, a wetting step (which may include steps using the aqueous hydrofluoric acid and the ozone water) is included, it is more effective to perform a water removing step (S30) of removing a liquid, remaining on the surface, from the wafer 10. The water removing step (S30) may include jetting of a liquid removing gas (for example, nitrogen gas) from the nozzles 192u and 192d.

Thus, the aqueous hydrofluoric acid is jetted from the nozzles 232u and 232d or the hydrogen fluoride gas is jetted from the nozzles 172u and 172d onto the surface of the wafer 10 having been converted into the hydrophilic state (S10). In this process, the wafer 10 is rotated at a comparatively low speed (for example, 200 rpm) so that the aqueous hydrofluoric acid or the hydrogen fluoride gas may be distributed uniformly across the surface in a similar manner as described above in step S2. By this step (S10), the surface of the wafer 10 is changed in a water-repellent state in a similar manner as described above in step S2. When supplying a processing agent including water such as aqueous hydrofluoric acid is stopped while the wafer 10 is continuously rotated, the water that possibly remains on the surface beads up (acquires a spherical shape) on the surface due to the water-repellent property and is removed from the surface of the wafer 10 readily by a centrifugal force resulting from the rotation of a comparatively low speed, and this may be the water removing step (S31). Thus, the surface of the wafer 10 looks dry from an appearance thereof. The centrifugal force particularly near the center of the wafer 10, however, is extremely small in theory while the centrifugal force is not very large because the rational speed is low. In such a case, water droplets left on the surface may be removed by additionally jetting the liquid removing gas in this water removing step (S31). The water droplets can thereby be moved at least toward the circumferential edge. At the circumferential edge, the centrifugal force is relatively larger, and thus it is possible to remove the water droplets from the edge portion (peripheral edge) of the wafer 10 to the outside of the system depending on the conditions.

The ozone gas is then jetted onto the wafer 10 that has the water-repellent surface (S40). The ozone gas may contain a predetermined concentration of gaseous ozone in a range of 1 ppm to 40% and, in addition, 0 to 99% of nitrogen, and oxygen as a major component of the remainder (likewise in (S40) as described later). The water left on the surface of the wafer 10 is evaporated and an oxide film is formed on the surface so as to cause a change to a hydrophilic state by jetting the ozone gas (S40). The oxide film protects the surface of the wafer 10 and can protect the surface of the wafer 10 until the wafer is transferred to the subsequent processing (for example, a device forming processing). The wafer having the surface thus dried and oxidized to form an oxide film thereon is taken out (S100) and conveyed to a section of the shipping or inspecting step.

Figure 4A:
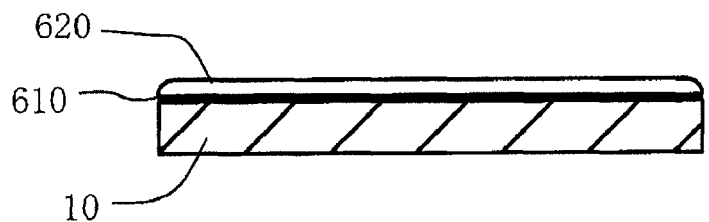
FIGS. 4A to 4C show changing states of the wafer surface in a chronological order.
Figure 4B:
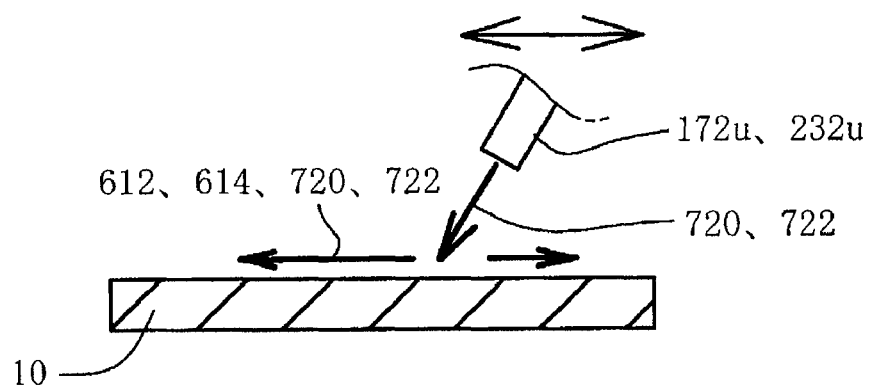
Figure 4C:
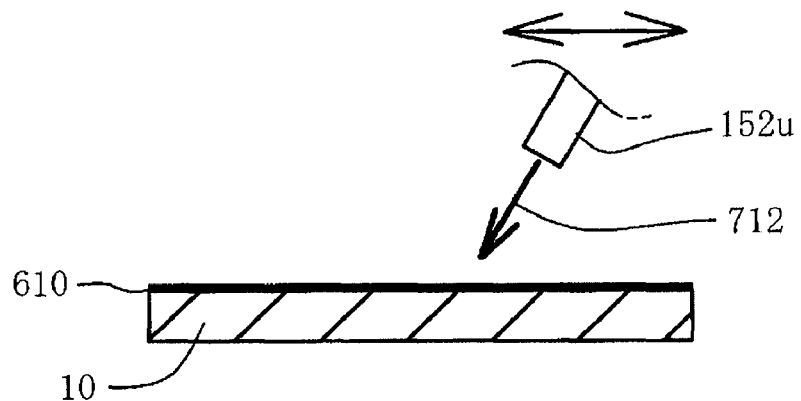

FIGS. 4A-4C schematically and sequentially illustrate changes of states of the surface of the wafer 10 in three steps corresponding to those as shown in FIG. 3. Although only the top surface of the wafer 10 is described for the explanation, it is considered that similar descriptions may apply to the bottom surface.

FIG. 4A schematically shows a state of the surface of the wafer 10 when step (S4) of FIG. 3 is completed. A thin oxide film (for example, $SiO_2$) 610 formed by the ozone water processing spreads across the surface of the wafer 10. Since the oxide film 610 is hydrophilic, the ozone water 620 spreads thereon with rather thick thickness.

FIG. 4B shows a state of surface of the wafer 10 in the step 10 (S10) of FIG. 3. The nozzle 232u or the nozzle 172u is installed in a manner enabling reciprocal movement above the wafer 10, and the aqueous hydrofluoric acid 720 or the hydrogen fluoride gas 722 is jetted. The aqueous hydrofluoric acid 720 or the hydrogen fluoride gas 722 pushes away the ozone water layer 620 as shown in FIG. 4A and directly contacts and causes a chemical reaction in the oxide film of the substrate. The aqueous hydrofluoric acid 720 or the hydrogen fluoride gas 722 dissolves or decomposes the oxide film (for example, $SiO_2$), thereby causing the oxide film 610 to disappear. The silicon metal that is water-repellent is thereby laid bare and the surface of the wafer 10 exhibits hydrophilicity.

FIG. 4C shows a state of the surface of the wafer 10 after step S40 of FIG. 3. Above the wafer 10, the nozzle 152u is installed by a holding jig that holds the nozzle 152u in a manner enabling reciprocal movement and the ozone gas 712 is jetted from the nozzle 152u. The ozone gas 712 then reacts with the silicon that is laid bare on the surface of the wafer 10 and forms a thin oxide film 610 as a protective film. At the same time, the aqueous hydrofluoric acid 720, etc., that may remain from step S10 of the present processing are blown away by the ozone gas 712 and cleaning by pure water (not shown) is performed.

In steps S2, S4, S10, and S40 as described above, the wafer 10 is rotated such that the various processing fluids 710, 720 and the processing gases 712, 722 may be uniformly and evenly jetted over the surface of the wafer 10. To meet the uniformity condition, the rotational speed may be set to not exceed 1500 rpm, or may furthermore be set to not exceed 500 rpm, and in some cases may be set to not exceed 300 rpm.

After performing the processing in the water repellent step of S2 or S10 such that a contact angle of water may be 12 degrees or more, the processing fluid is shut off to stop the supply thereof, and then a water removal step may start by rotating the wafer 10 as it is in the wet state (S31). In this case, it is possible to rotate the wafer 10 at a rotational speed enabling the water on the surface to move close to the circumferential edge and leave there. Such rotational speed, for example, may be approximately 1500 rpm, furthermore approximately 500 rpm, and yet furthermore approximately 300 rpm. The rotational speed may be selected from these or else as appropriate according to a water-repellent state of the wafer 10, a type of the water, a temperature thereof, and other conditions.

On the other hand, in the ordinary drying method called a spin drying, it is important to rotate the wafer at a rotational speed of exceeding 1500 rpm, or furthermore at least 2000 rpm, and yet furthermore at least 2500 rpm since it is necessary to remove the water adequately even if the surface state of the wafer 10 is hydrophilic. When the wafer is rotated at such a rotational speed, the force applied to the wafer 10 is not necessarily negligible.

Figure 7:
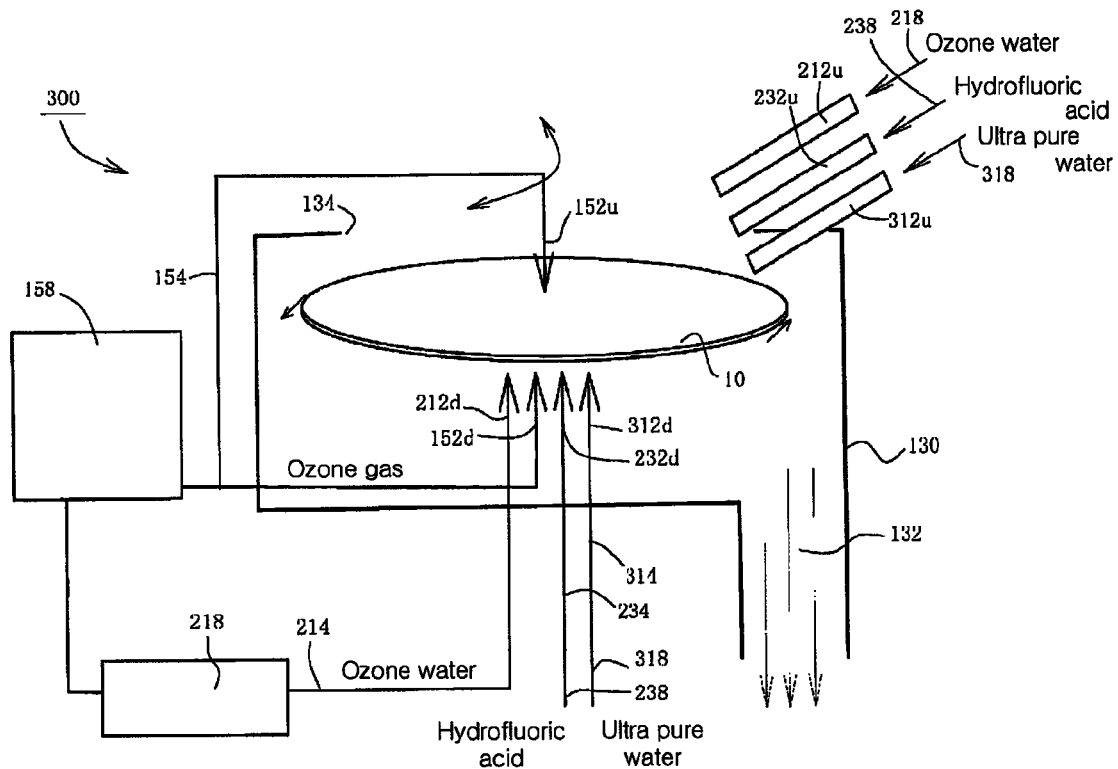
FIG. 7 is a schematic diagram showing a wafer processing apparatus according to Embodiment 2.

FIG. 7 is a schematic diagram showing a wafer processing apparatus 300 according to Embodiment 2 of the present invention. Although the apparatus 300 is basically configured in the same way as the wafer processing apparatus 100 of FIG. 1, it differs in that ultrapure water 318 is prepared and can be jetted onto the bottom surface and the top surface of the wafer 10 from a nozzle 312d and a nozzle 312u connected to pipes 314.

Figure 5:
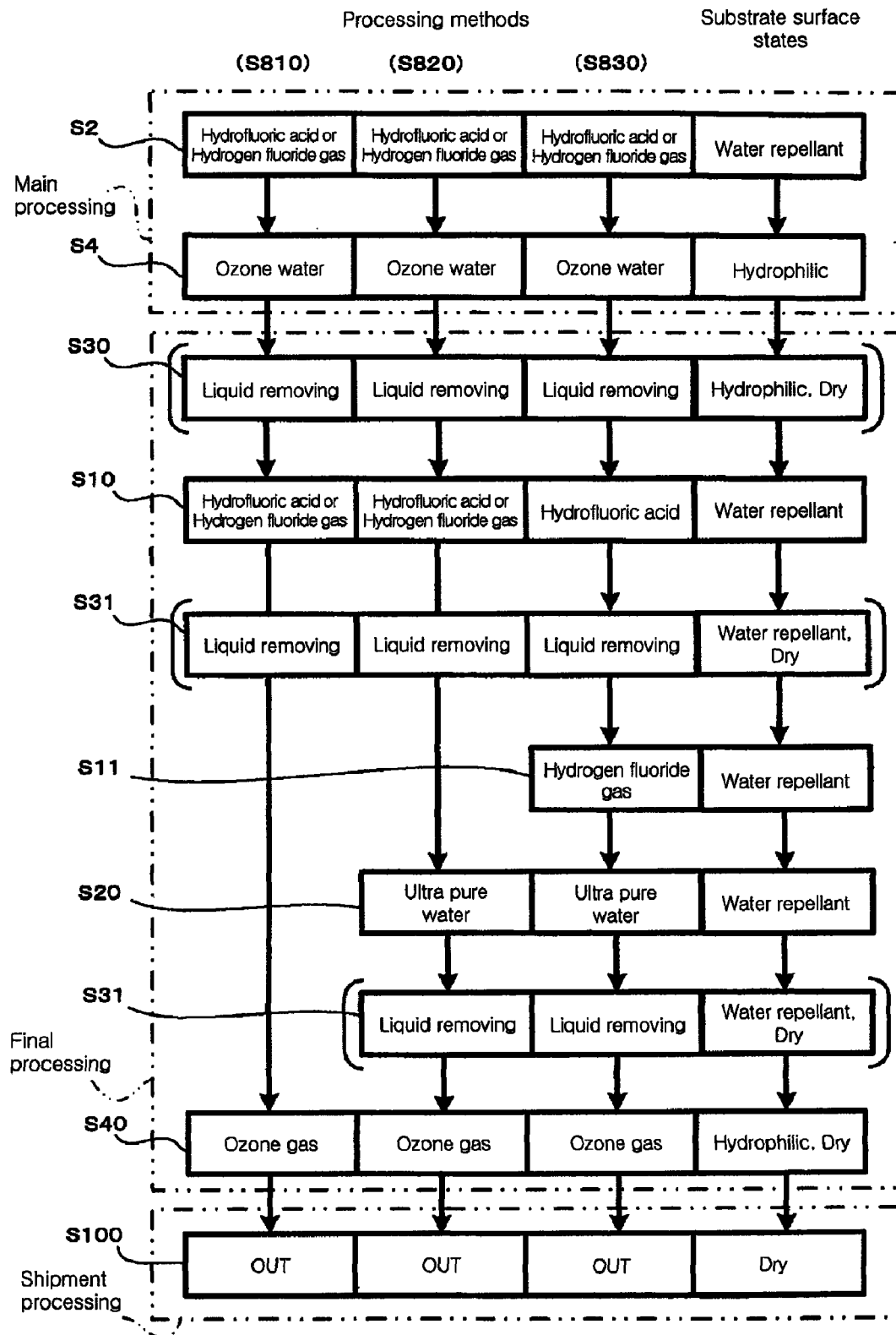
FIG. 5 shows a main flowchart of a processing method of the surface of the semiconductor wafer according to Embodiments 2 and 3 of the present invention.

FIG. 5 shows a flowchart concerning a processing method for the surface of the wafer 10 according to Embodiments 2 and 3 of the present invention. Collectively named Processing method (S820) indicates processing steps according to Embodiment 2, and Processing method (S830) indicates processing steps according to Embodiment 3. Processing method (S810) indicates processing method according to Embodiment 1 and is shown here as the reference for comparison with Embodiments 2 and 3. In a similar manner as with Processing method (S810) of FIG. 3, the right column as being referred to Substrate surface state describes the states of the surface of the wafer 10. These processing methods will be described concretely.

Embodiment 2

Processing Method

The Processing method (S820) is constituted of a main processing (S2, S4), a final processing (S10, S20, S40), which is a processing method according to Embodiment 2, and a shipment processing (S100). Also if necessary, the final processing may include water removing steps (S30, S31).

In a similar way as described in the case of FIG. 3, the wafer 10 is put into the chamber 130 from the entrance opening 134 and placed on the mounting member. Upon confirming that the wafer 10 is fixed adequately, aqueous hydrofluoric acid is jetted from the nozzles 232$u$, 232$d$ or hydrogen fluoride gas is jetted from the nozzles 172$u$, 172$d$ onto the wafer 10 (S2). In this process, the wafer 10 is rotated at a comparatively low speed (for example, 200 rpm) so that the aqueous hydrofluoric acid or the hydrogen fluoride gas is distributed uniformly across the surface. Then, an oxide film on the surface of the wafer 10 is dissolved and removed by either or both of the aqueous hydrofluoric acid and the hydrogen fluoride gas (S2) such that the surface is converted into a water-repellent state where the water is repelled even if, for example, pure water is brought into contact with the surface. Ozone water is then jetted from the nozzles 212$u$, 212$d$ onto the surface of the wafer 10 (S4). In this process, the wafer 10 is likewise rotated at a comparatively low speed (for example, 200 rpm) so that the ozone water is distributed uniformly across the surface. Through this processing, the silicon at the surface is oxidized to form an oxide film and is put in a hydrophilic state (S4). Here, the water removing step (S30) may be performed to remove the ozone water on the surface of the wafer 10. Here, water cannot be removed as spherical water droplets roll out on a hydrophilic surface, but the water removing step may somewhat reduce the amount of water.

As described above, the surface of the wafer is converted into a hydrophilic state and aqueous hydrofluoric acid is jetted from the nozzles 232$u$, 232$d$ or hydrogen fluoride gas is jetted from the nozzles 172$u$, 172$d$ onto the surface of the wafer 10 (S10). In this processing method, the wafer 10 is rotated at a comparatively low speed (for example, 200 rpm) so that the aqueous hydrofluoric acid or the hydrogen fluoride gas is distributed uniformly across the surface in a similar manner as described in step S2. The surface of the wafer 10 is changed into a water-repellent state through this processing method (S10) in a similar manner as described in step S2. Here, when the supply of the aqueous hydrofluoric acid and so on containing water is stopped and the wafer 10 is just rotated, the possibly remaining water acquires a spherical shape (forms a water droplet) on the surface because of the water-repellent property such that water in the spherical shape is readily removed from the surface of the wafer 10 by a centrifugal force caused by the rotation at a comparatively low speed (S31). As described above, the water removing step (S31) in which the liquid removing gas is further jetted may be performed. Also, the supply of the aqueous hydrofluoric acid may be stopped after the step of S10 (S31), and the liquid removing gas may be jetted together with the hydrogen fluoride gas. The wafer 10 (and a surface thereof) is further washed with ultrapure water (S20) in order to wash off residue from the processing by the aqueous hydrofluoric acid or the hydrogen fluoride gas. In this wash (or cleaning), except using the ultrapure water as the cleaning liquid, a similar operation is conducted as that of the processing step of S4 or S10. Therefore, the wafer 10 is rotated, for example, at 200 rpm. When the supply of the ultrapure water is stopped and the wafer 10 is continuously rotated at a predetermined speed, in terms of appearance, the surface of the wafer 10 appears to be dry (S31). Here, the water removing step (S31) of jetting the liquid removing gas may also be performed as described above.

Ozone gas is then jetted onto the wafer 10 that has the water-repellent surface (S40). By jetting the ozone gas, the evaporation of water on the surface of the wafer 10 and the change in state to a hydrophilic state due to formation of an oxide film occur (S40). The oxide film protects the surface of the wafer 10 and can protect the surface of the wafer 10 until the wafer 10 is transferred to the subsequent processing (for example, the device forming processing). The wafer 10 having the surface thus dried and the oxide film formed is taken out (S100) and conveyed to a shipping or inspection step.

Embodiment 3

Processing Method

The Processing method (S830) is constituted of a main processing (S2, S4), a final processing (S10, S11, S20, S40), which is a processing method according to Embodiment 3, and a shipment processing (S100). Also if necessary, the final processing may include water removing steps (S30, S31).

Because the main processing (S2, S4) is practically the same as what has been described above, explanation thereof is omitted here. If the liquid possibly remaining on the surface is to be removed more aggressively after the step S4, the water removing step (S31) of jetting the liquid removing gas may be performed as described above.

Aqueous hydrofluoric acid is jetted from the nozzles 232$u$, 232$d$ onto the surface of the wafer 10 having been made hydrophilic in the step S4, and, at the same time, the wafer 10 is rotated, for example, at 200 rpm (S10). If the aqueous hydrofluoric acid that possibly remains on the surface is to be removed aggressively, the water removing step (S31) of continuing rotation after stopping the supply of the aqueous hydrofluoric acid may be performed as described above as well as the water removing step (S31) of jetting the liquid removing gas. In the step S10, the liquid removing gas may be jetted along with the aqueous hydrofluoric acid in order to remove the liquid on the surface of the wafer readily. The hydrogen fluoride gas is then jetted from the nozzles 172$u$, 172$d$ onto the surface of the wafer 10 and, at the same time, the wafer 10 is rotated, for example, at 200 rpm (S11). In this process, the wafer 10 is rotated at a comparatively low speed (for example, 200 rpm) so that the aqueous hydrofluoric acid or the hydrogen fluoride gas is distributed uniformly across the surface in a similar manner as described in the step S2. A difference from the processing method (S820) is that the aqueous hydrofluoric acid processing method (S10) and the hydrogen fluoride gas processing step (S11) are performed in this sequence, and when this processing method is performed as described, impurities resulting from the ozone water processing can be cleaned off adequately through the aqueous hydrofluoric acid processing step (S10) and thereby a uniform oxide film may be formed on the surface with ease (S11). In the step S11, the liquid removing gas may be jetted along with the aqueous hydrofluoric acid in order to remove the liquid on the surface of the wafer readily. The wafer 10 (and a surface thereof) is further washed with ultrapure water (S20) in order to wash off residue from the processing by the aqueous hydrofluoric acid and the hydrogen fluoride gas. In this wash (or cleaning), except using the ultrapure water as the cleaning liquid, a similar operation is conducted as that of the processing step of S4 or S10. Therefore, the wafer 10 is rotated, for example, at 200 rpm. When the supply of the ultrapure water is stopped and the wafer 10 is continuously rotated at a predetermined speed, in terms of appearance, the surface of the wafer 10 appears to be dry (S31). If the aqueous hydrofluoric acid that possibly remains on the surface is to be removed aggressively, the water removing step (S31) of jetting the liquid removing gas may also be performed as described above.

The step (S40) of jetting the ozone gas onto the wafer 10 that has the water-repellent surface is performed next, and explanation thereof will be omitted here since it is the same as what is aforementioned. The shipment processing step (S100) is performed next, and explanation thereof will be omitted here since it is the same as what is aforementioned.

As described above, since it is not necessary to rotate the mounting member for the other purposes than that the processing fluids 710, 720 and the processing gases 712, 722 are jetted on the surface of the wafer 10 uniformly and evenly, it is sufficient to rotate the wafer 10 at a comparatively low rotation speed, e.g., not exceeding 1500 rpm, thereby enabling the force applied to the wafer 10 to be made small.

Figure 6:
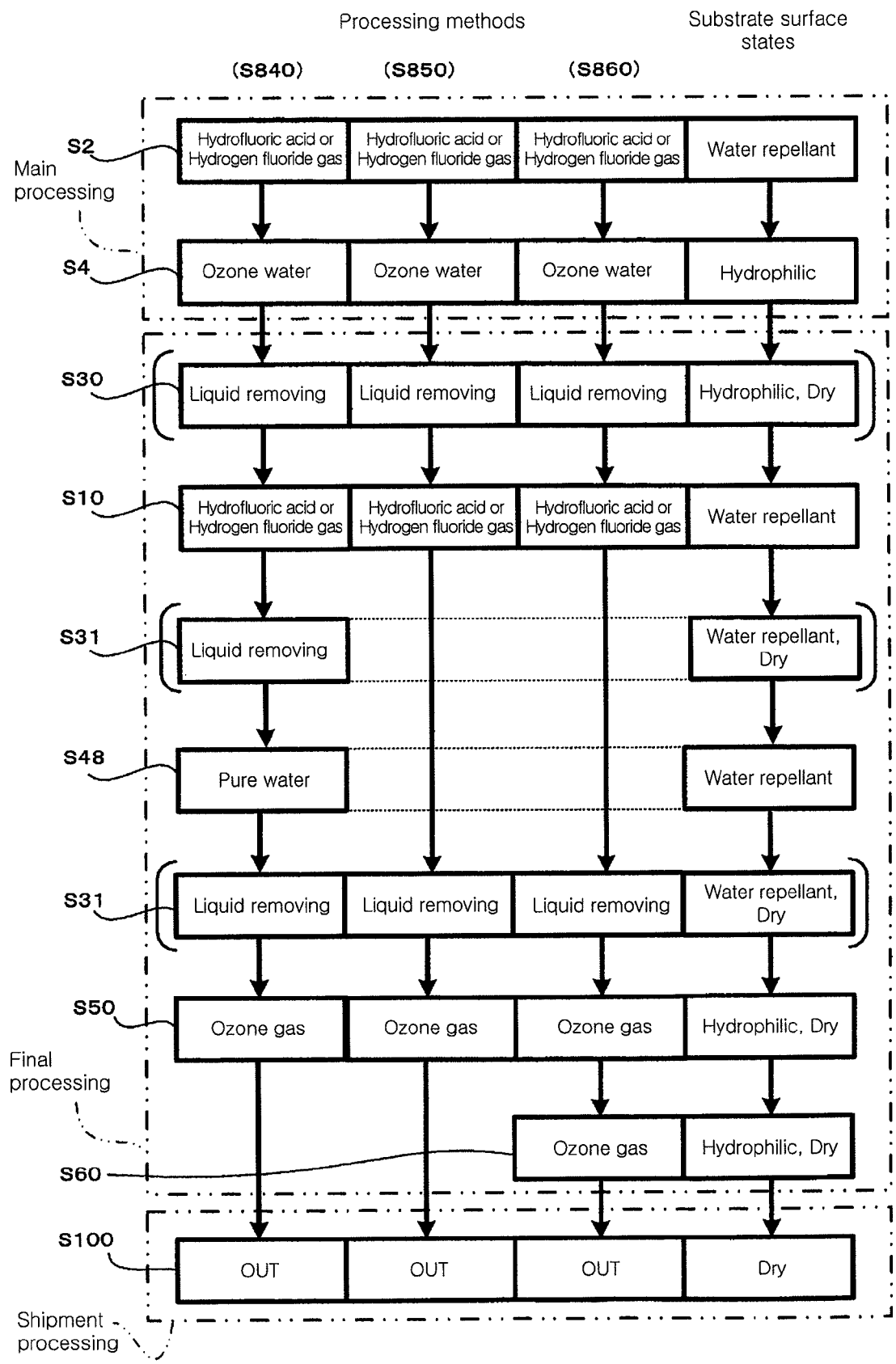
FIG. 6 shows a main flowchart of a processing method of the surface of the semiconductor wafer according to Embodiments 4-6 of the present invention.

FIG. 6 shows a flowchart of examples of processing methods (S840, S850, S860) of the wafer 10 concerning Embodiments 4-6 of the present invention.

In this figure, the rightmost column has a heading of substrate surface state so as to indicate the state of the surface of the wafer 10 after each step. These processing methods will now be described concretely.

Embodiment 4

Processing Method

The Processing method (S840) is constituted of a main processing (S2, S4), a final processing (S10, S48, S50), which is a processing method according to Embodiment 4, and a shipment processing (S100).

Because the main processing (S2, S4) is practically the same as what has been described above, explanation thereof is omitted here. The final processing (S10, S48, S50) may include the water removing steps (S30, S31).

After the step (S4) is conducted such that the surface of the wafer 10 is changed into the hydrophilic state, with or without the water removing step (S30), aqueous hydrofluoric acid is jetted from the nozzles 232u, 232d; or hydrogen fluoride gas is jetted from the nozzles 172u, 172d onto the surface of the wafer 10, and, at the same time, the wafer 10 is rotated, for example, at 200 rpm (S10). Through this step, the surface of the wafer 10 is changed into the water-repellent state (S10) in a similar manner as described in the step (S2). Because a processing agent containing water is not supplied, the water that possibly remains on the surface forms water droplets on the surface due to the water-repellent property and is removed from the surface of the wafer 10 readily by the centrifugal force resulting from the rotation of comparatively low speed (S10). Here, the water removing step (S31) of using wind force to remove the aqueous hydrofluoric acid from the surface of the wafer 10 may furthermore be performed. In the step S10, the aqueous hydrofluoric acid or the hydrogen fluoride gas may be jetted together with the liquid removing gas, thereby enabling the liquid removal in a similar manner as described in the water removing step (S31). The surface is then cleaned by pure water (S48). In this cleaning processing, a similar operation as described in the processing step of S4 or S10 is performed except using the pure water as the cleaning liquid. Therefore, the wafer 10 is rotated, for example, at 200 rpm. Because the surface is water-repellent, the surface of the wafer 10 appears to be dry (S31) when the supply of the ultrapure water is stopped while the rotation is continued. Here, as an option, the water removing step (S31) of using wind force to remove aqueous hydrofluoric acid from the surface of the wafer 10 may be performed.

Ozone gas is then jetted onto the wafer 10 having the water-repellent surface (S50). The ozone gas may contain a predetermined concentration of ozone (gas) in a range of 1 ppm to 40%. The remainder may include oxygen (hereinafter the same in the step (S50)). Besides the ozone (gas), the ozone gas may contain 0 to 99% of nitrogen or 0 to 99% of carbon dioxide. By jetting the ozone gas, the water on the surface of the wafer 10 evaporates and the surface state is changed into the hydrophilic state because an oxide film is formed (S50). The oxide film is a surface protection of the wafer 10 and can protect the surface of the wafer 10 until it is transferred to the subsequent processing (for example, the device forming processing). As described above, the wafer 10 with the surface dried and covered with the oxide film is moved out of the line (S100) and conveyed to the shipping or inspection step.

Embodiment 5

Processing Method

The Processing method (S850) is constituted of a main processing (S2, S4), a final processing (S10, S50), which is a processing method according to Embodiment 5, and a shipment processing (S100).

Because the main processing (S2, S4) is practically the same as what has been described above, explanation thereof is omitted here. The final processing (S10, S50) may include the water removing steps (S30, S31).

After the step (S4) is conducted such that the surface of the wafer 10 is changed into the hydrophilic state, with or without the water removing step (S30), aqueous hydrofluoric acid is jetted from the nozzles 232u, 232d; or hydrogen fluoride gas is jetted from the nozzles 172u, 172d onto the surface of the wafer 10, and, at the same time, the wafer 10 is rotated, for example, at 200 rpm (S10). Through this step, the surface of the wafer 10 is changed into the water-repellent state (S10) in a similar manner as described in the step (S2). Unless a processing agent containing water is supplied, the water that possibly remains on the surface forms water droplets on the surface due to the water-repellent property and is removed from the surface of the wafer 10 readily by the centrifugal force resulting from the rotation of comparatively low speed (S10). Here, the water removing step (S31) of using wind force to remove the aqueous hydrofluoric acid from the surface of the wafer 10 may furthermore be performed.

Ozone gas is then jetted onto the wafer 10 having the water-repellent surface (S50). By jetting the ozone gas, the surface of wafer 10 is changed into the hydrophilic state because the oxide film formed thereon (S50). The oxide film that is the surface protection of the wafer 10 and can protect the surface of the wafer 10 until it is transferred to the subsequent processing (for example, the device forming processing). The wafer 10 with the surface thus dried and the oxide film formed is taken out (S100) and conveyed to the shipping or inspection step.

Embodiment 6

Processing Method

The Processing method (S860) is constituted of a main processing (S2, S4), a final processing (S10, S50, S60), which is a processing method according to Embodiment 6, and a shipment processing (S100).

Because the main processing (S2, S4) is practically the same as what has been described above, explanation thereof is omitted here. In the final processing, the processing is the same as that in the previous example processing method (S850) except adding the processing with the ozone gas (S60). Therefore, the other explanation than that of the step (S60) will be omitted.

The ozone gas is further applied to the wafer 10 (S60), the surface of which has been changed into the hydrophilic state in the step (S50). The ozone gas may contain a predetermined concentration of gaseous ozone in a range of 1 ppm to 40% and, in addition, 0 to 99% of nitrogen, and oxygen as a major component of the remainder. Here, the wafer 10 is also rotated as described above. Although the surface is already made hydrophilic in the previous step (S50), a more stable protective film can be deposited thereon by further developing the oxide film (S60). Therefore, the surface of the wafer 10 can be protected until the wafer 10 is transferred to the subsequent processing (for example, the device forming processing). The wafer 10 with the surface thus dried and the oxide film formed thereon is taken out (S100) and conveyed to the shipping or inspection step.

According to the aforementioned, it is not necessary to conduct a fast spin for drying the wafer 10 which may be produced through any one of the above-mentioned processing methods (S840, S850, S860) as well as the previously mentioned processing method (S810) although each processing method includes a wet processing, and it is sufficient for the drying purpose to rotate the wafer at a comparably low rotational speed, e.g., not exceeding 1500 rpm. Therefore, the stress generated in the wafer 10 can be suppressed.

The processing method of the semiconductor wafer according to the present invention will be compared with comparative examples. The comparison is made by comparing the characteristics of wafers 10 of Experimental examples 1 and 2 produced by the processing method according to the present invention with those of wafers of Comparative experimental examples 1 and 2 produced by the comparative processing method. Characteristics of wafers of Comparative experimental example 3 produced by another processing method are also utilized for the comparison. As the processing method according to the present invention, the specific methods of the above-described examples were employed and the apparatus shown in FIG. 1 was used.

As the processing method of the semiconductor wafer according to the present invention, the apparatus shown in FIG. 1 was used and the method of the above-described embodiment was performed. Specifically, processing was performed according to Embodiment 1 (S810) as shown in FIG. 3 to produce the wafers 10 of Experimental examples 1 and 2. Wafers after processing by aqueous hydrofluoric acid (S10) in Embodiment 1 (S810) shown in FIG. 3 were used as Reference experimental example 1. Specifically, with each of Experimental examples 1 and 2, wafers 10 of a 450 mm diameter were processed with aqueous hydrofluoric acid (S2), processed with ozone water (S4), processed with aqueous hydrofluoric acid (S10), subject to the water removing step (S31) of continuing rotation without supplying aqueous hydrofluoric acid, and processed with the ozone gas (S40) to produce semiconductor wafers.

Figure 17:
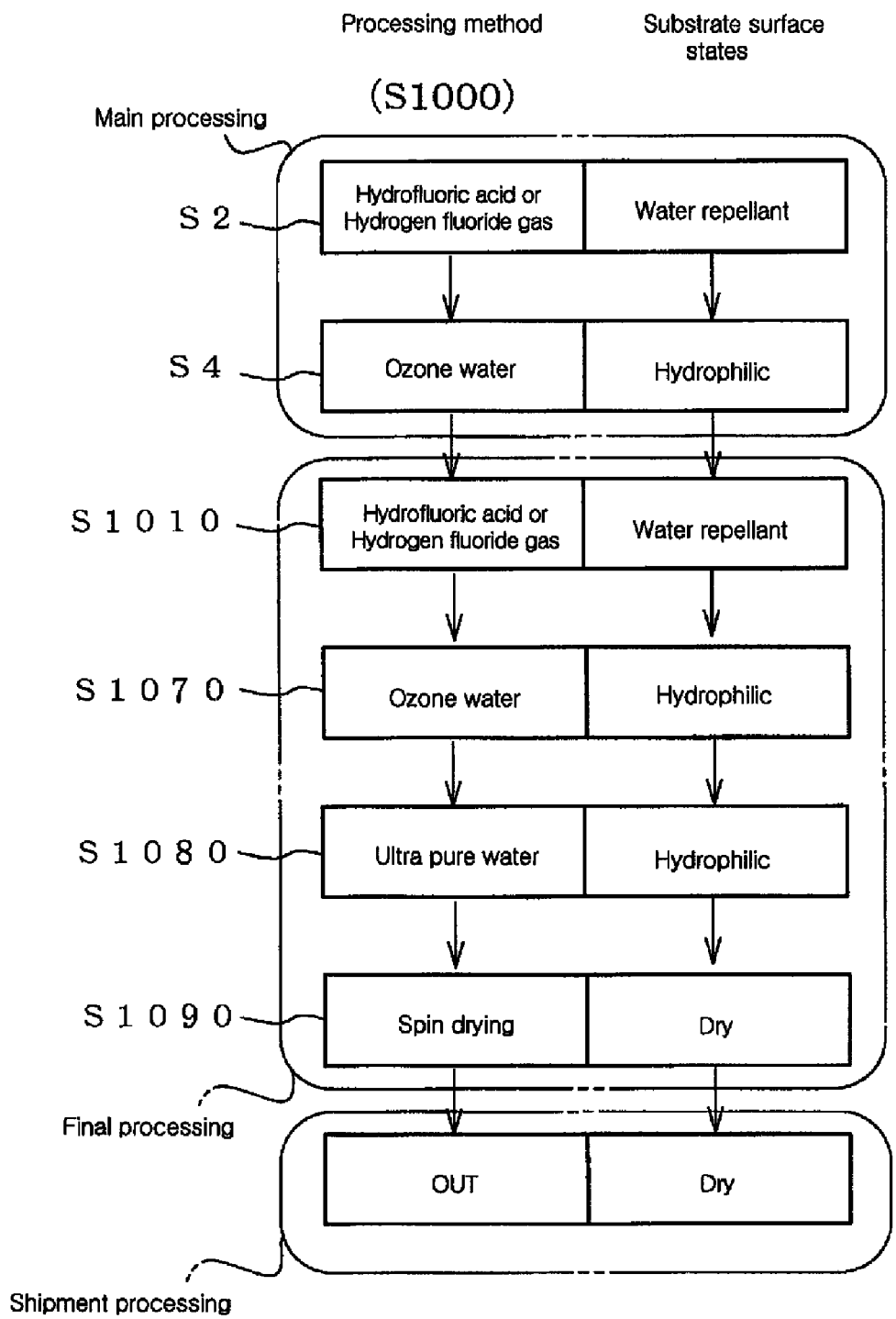
FIG. 17 shows a main flowchart of a processing method of the wafer according to the prior art.

On the other hand, as the processing method to be compared with the Examples, the processing method of a comparative example (S1000) as shown in FIG. 17 was performed. Specifically, wafers 10 of a 300 mm diameter were processed with the aqueous hydrofluoric acid (S2), processed with the ozone water (S4), and the wafers 10 having the surfaces having been made hydrophilic were processed with aqueous hydrofluoric acid (S1010), processed further with ozone water (S1070), processed with ultrapure water (S1080), and dried by spin drying (S1090). The wafers of Comparative experimental examples 1 and 2, respective surfaces of which were covered with oxide protective films, were thus produced.

As another processing method, although not illustrated, another comparative example that includes processing by an SC-1 solution was performed. Specifically, wafers 10 of a 300 mm diameter were processed with the aqueous hydrofluoric acid, processed with the ozone water, and the wafers 10 with surfaces thereof made hydrophilic were processed with the aqueous hydrofluoric acid, processed with the SC-1 solution containing hydrogen peroxide water, processed with the ultrapure water, and dried by spin drying. By performing the processing step including the SC-1 solution processing to be used for the RCA cleaning, the wafers 10 of Comparative experimental example 3 were obtained.

Figure 8A:
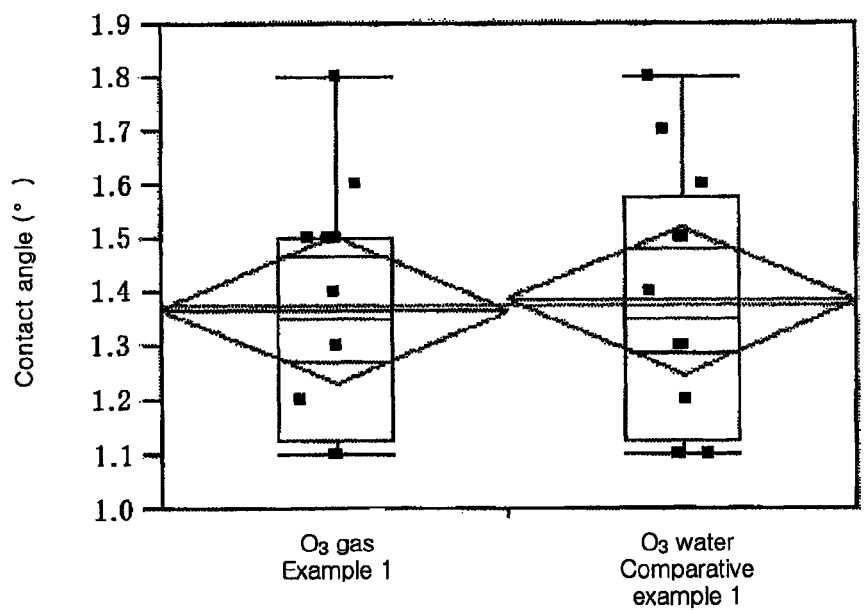
FIG. 8A is a graph showing contact angles of examples and comparative examples.
Figure 8B:
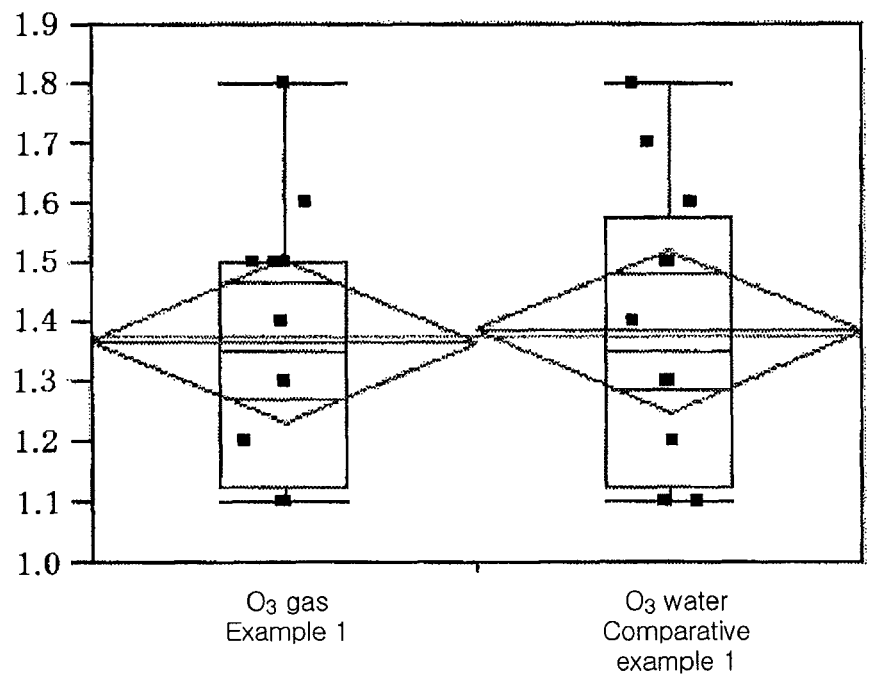
FIG. 8B is a graph showing particle numbers of examples and comparative examples.
Figure 8C:
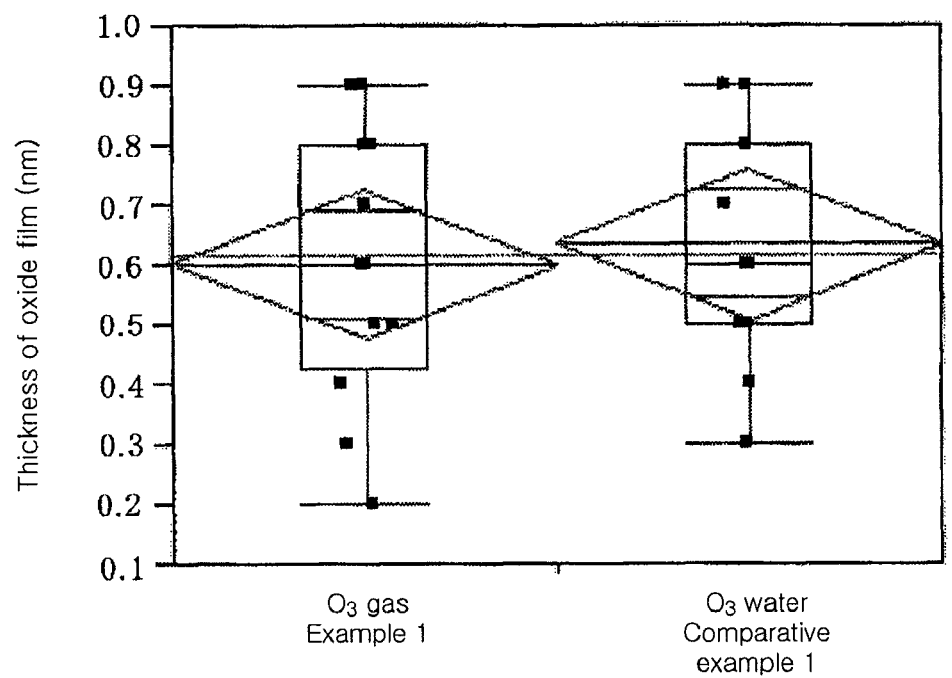
FIG. 8C is a graph showing thicknesses of oxide films of examples and comparative examples.

FIGS. 8A to 8C show respective characteristics of Experimental example 1 and Comparative experimental example 1. FIG. 8A illustrates a graph showing the contact angle of water of Experimental example 1 and Comparative experimental example 1. FIG. 8B illustrates a graph showing the number of particles of water of Experimental example 1 and Comparative experimental example 1. FIG. 8C illustrates a graph showing the thickness of the oxide film on the wafer of Experimental example 1 and Comparative experimental example 1.

Figure 9A:
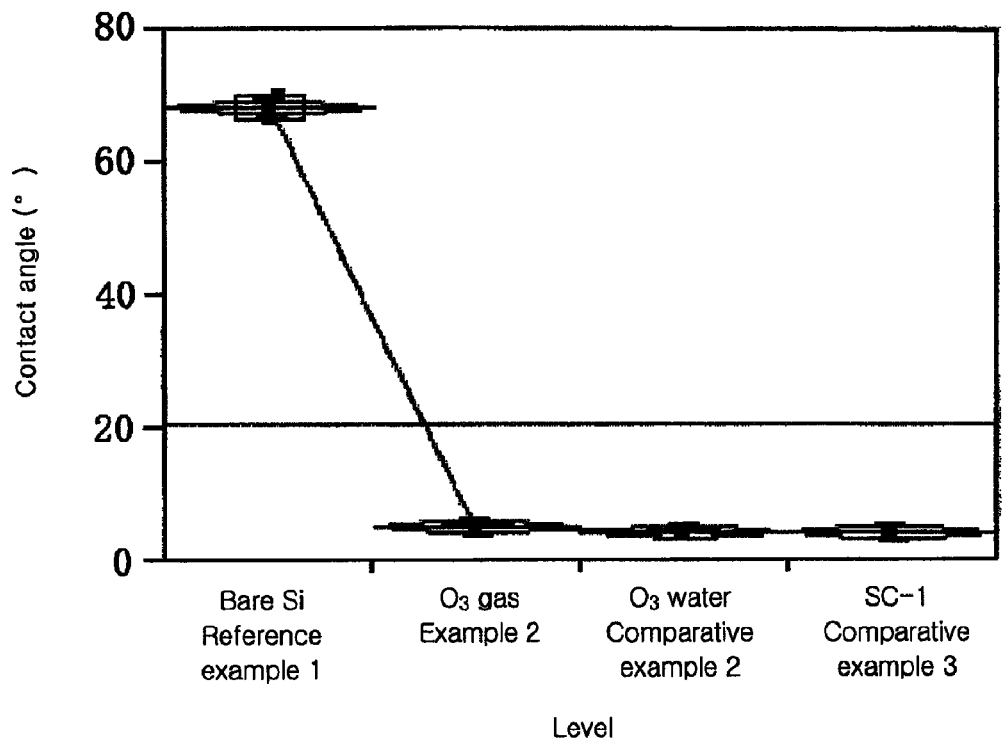
FIG. 9A is a graph showing contact angles of water on various wafers such as reference, example 2, and comparative examples.
Figure 9B:
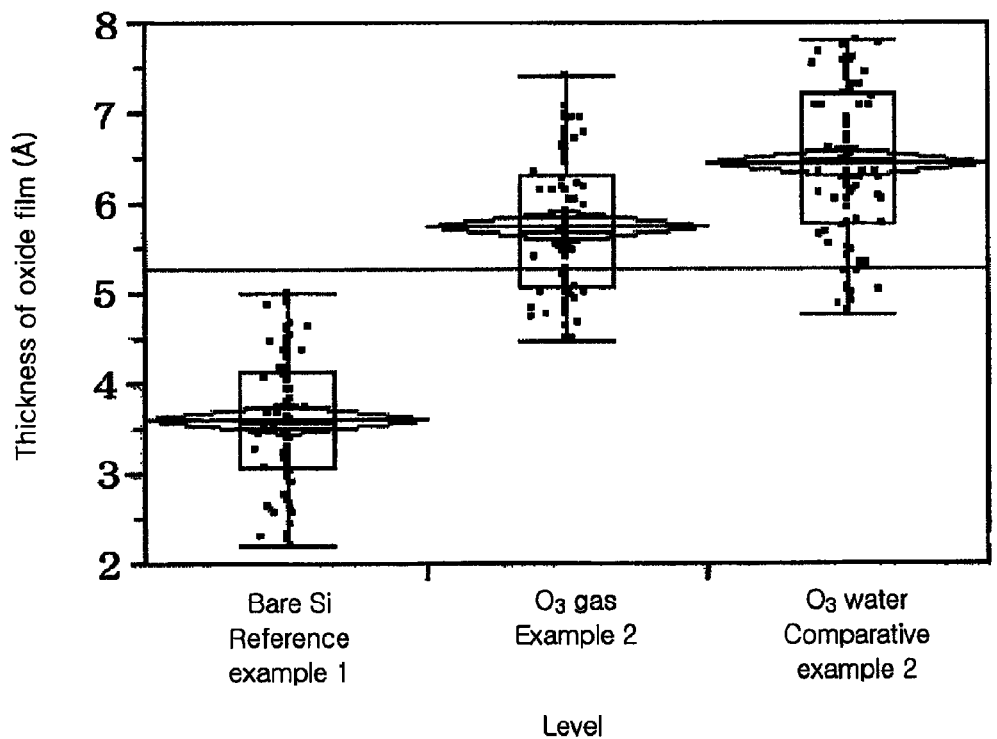
FIG. 9B is a graph showing thicknesses of oxide films of various wafers such as reference, example 2, and comparative examples.

FIGS. 9A and 9B show respective characteristics of Experimental example 2, Comparative experimental examples 2 and 3, and Reference experimental example 1. FIG. 9A illustrates a graph showing the contact angles of waters thereof, and FIG. 9B illustrates a graph showing the thickness of oxide films on the waters of Experimental example 2, Comparative experimental example 2, and Reference experimental example 1.

In Table 1, median values are extracted and shown representative values of the contact angle and the thickness of the oxide film from FIGS. 8 and 9.

TABLE 1

| | Quality evaluation of wafers after ozone gas drying (median) | | | | | | |
| --- | --- | --- | --- | --- | --- | --- | --- |
| | Example 1 | Example 2 | Comparative examples | | | Reference example | |
| | ple 1 | ple 2 | CE 1 | CE 2 | CE 3 | R 1 | Evaluation |
| Contact angle (°) | 3.98 | 5.00 | 3.02 | 4.20 | 4.00 | 66.00 | Equivalent |
| Thickness of oxide film (Å) | 6.00 | 5.70 | 6.20 | 6.40 | — | 3.60 | Equivalent |

First, the contact angles of water shown in Table 1 or in FIGS. 8A and 9A were all measured in the same manner using a contact angle measuring device. The measurement results of the contact angle of water were approximately 3.98 degrees and approximately 5.00 degrees for Experimental examples 1 and 2, respectively. On the other hand, for Comparative experimental example 1 and Comparative experimental example 2, the results were approximately 3.02 degrees and approximately 4.20 degrees, respectively. For Comparative experimental example 3, the result was approximately 4.00 degrees. It can thus be understood that Experimental examples 1 and 2, produced through the Embodiment 1 (S810) as shown in FIG. 3, that is, the ozone gas processing, were adequately hydrophilized as well as Comparative experimental examples 1 and 2, produced through Comparative example (S1000) shown in FIG. 17, that is, the ozone water processing. It can also be understood that the degree of hydrophilization of the Experimental examples 1 and 2 was as high as that of the Comparative experimental example 3 produced through another unillustrated comparative example, that is, the SC-1 solution processing. Furthermore, quality reproducibility of the wafers produced through the Embodiment 1 (S810) shown in FIG. 3 was confirmed since the water contact angle measurement of the Experimental example 2 shows substantially the same result with Experimental example 1. With Reference experimental example 1, which was obtained after the aqueous hydrofluoric acid processing (S10) of the Embodiment 1 (S810) as shown in FIG. 3, the contact angle of water was 66 or more degrees and it was thus found that the water on the surface of the wafer 10 was removed extremely well.

FIG. 10 is a diagram illustrating each location on the wafer 10 where the contact angle was measured with Experimental example 1 and Comparative experimental example 1. The contact angle measurements were made on three places (or points) marked with X's, respectively, located somewhat to the right from the vertical center line aligned with a notch indicating a predetermined crystal direction on the wafer 10. Ten wafers of the Experimental example 1 were measured and ten wafers of the Comparative example 1 were measured as well, and then an average value for Experimental example 1 and an average value for Comparative experimental example 1 were determined respectively such that the two average values are compared by calculating a ratio of them to find it is substantially 1.

The film thickness measurements of the oxide films shown in Table 1 or in FIGS. 8C and 9C were conducted in the same manner using an ellipsometer. For Experimental example 1 and Comparative experimental example 1, ten locations were measured with a single wafer 10, and for Experimental example 2, Comparative experimental example 2, and Reference experimental example 1, eighty one locations were measured. The film thickness measurement results of the oxide films were approximately 6.0 Å and approximately 5.7 Å for Experimental examples 1 and 2, respectively. On the other hand, the film thickness measurement results of the oxide films of Comparative experimental examples 1 and 2 were approximately 6.2 Å and approximately 6.4 Å, respectively. It can thus be understood that an oxide film of preferable thickness of at least 5.0 Å was formed with each of the Experimental examples 1 and 2, produced through the Embodiment 1 (S810) as shown in FIG. 3, that is, the ozone gas processing, and thus that each oxide film was an adequately thick oxide film as obtained with Comparative experimental examples 1 and 2 produced through the comparative example (S1000) as shown in FIG. 17, that is, the ozone water processing. Also, quality reproducibility of the wafer produced through the Embodiment 1 (S810) shown in FIG. 3 was confirmed since Experimental example 1 showed substantially the same measurement results of oxide film thickness as Experimental example 2. Although an oxide film of approximately 3.6 Å thickness was formed with Reference experimental example 1 obtained after the aqueous hydrofluoric acid processing (S10) in the Embodiment 1 (S810) as shown in FIG. 3, it is considered that this was caused by surface oxidation of the wafer 10 with oxygen in the air during a period of time before the actual measurement.

Then, contour drawings (not shown) were prepared by plotting respective measurement data of oxide film thickness of Experimental example 2, Comparative experimental examples 2 and 3, and Reference experimental example 1, and these examples were compared. As a result, a difference between a maximum value and a minimum value of the film thicknesses of the oxide films (hydrophilic films) was approximately 3 Å with Experimental example 2 and contours were also drawn with substantially equal intervals. Similar results were obtained with Comparative experimental examples 2 and 3. It can thus be understood that a flat oxide film (hydrophilic film) was formed in the Experimental example 2, produced through the Embodiment 1 (S810) as shown in FIG. 3, as in Comparative experimental example 2, produced through the comparative example (S1000) as shown in FIG. 17, that is, the ozone water processing, and in Comparative experimental example 3, produced through the other comparative example (not shown), that is, the SC-1 solution processing. Here, although the film thickness of the surface was approximately 3.6 Å, which was rather thin if compared to Experimental example 2 and Comparative experimental examples 2 and 3 with the Reference experimental example 1 obtained immediately after the aqueous hydrofluoric acid processing (S10) in the Embodiment 1 (S810) as shown in FIG. 3, the difference between the maximum value and the minimum value of the film thicknesses was approximately 3 Å, which was rather thin, and the contours were drawn with substantially the same intervals such that it can be understood that a flat surface was formed.

Then, a cleanliness of the surface of each wafer 10 was examined by counting the number of particles per unit area on the surface of the wafer 10 by a particle counter. As shown in FIG. 8B, it can be understood that the wafer 10 of the Experimental example 1 has a highly clean surface as the number of particles deposited thereon was less than that with Comparative experimental example 1. Although the surface cleanliness of the wafer 10 of neither of Experimental example 2 and Comparative experimental example 2 is illustrated, the particles deposited onto the surface were detected by a laser surface detector and visualized as bright points (LPDs: light point defects) such that the surface cleanliness was compared. As a result, the Experimental example 2 had as few particles detected as the Comparative experimental example 2 such that it can thus be understood that the surface cleanliness of the wafer 10 with the Experimental example 2 was of high quality. Furthermore the reproducibility of the wafer quality by the Embodiment 1 (S810) shown in FIG. 3 was confirmed because similar measurement results showing high cleanliness were obtained with both Experimental examples 1 and 2.

Whereas a processing time of the Comparative example (S1000) as shown in FIG. 17, through which the Comparative experimental example 1 was produced, was 2 minutes and 30 seconds, the processing time of the Embodiment 1 (S810) as shown in FIG. 3, through which the Experimental example 1 was produced, was 2 minutes such that approximately 20% reduction of time was achieved.

Thus, when the Embodiment 1 (S810) utilizing the ozone gas as shown in FIG. 3 is adopted, a significant reduction of processing time may be achieved while the wafer 10 produced by the Embodiment 1 may have as high quality as the wafer produced by the Comparative example (S1000) utilizing the ozone water as shown in FIG. 17.

Next, wafers 10 of the Experimental example 3 were produced by performing the Embodiment 2 (S820) as shown in FIG. 5 and their characteristics were examined. Specifically, in the concrete steps according to Embodiment 2 (S820), wafers 10 with a 450-mm diameter were processed with aqueous hydrofluoric acid (S2), processed with ozone water (S4), processed with aqueous hydrofluoric acid (S10), processed with ultrapure water (S20), and processed with jetted gas which contained 2% gaseous ozone and had a flow rate of 10 L/min for 2 minutes (S40). The ozone gas containing gaseous ozone still contained 0.5% nitrogen and the remainder, a large portion of which was oxygen.

Also, the wafer 10 has the silicon surface subject to the change from water-repellent to hydrophilic as an oxide film is formed thereon in accordance with the Embodiment 2 (820) in which the ozone gas is utilized. Since the processing step according to the Embodiment 2 (S820) is the processing step of the Embodiment 1 (S810) utilizing ozone gas as shown in FIG. 3 to which simply the cleaning step by ultrapure water (S20) is added, it is clear that the processing step with ozone gas (S40) is not affected by such addition and this has been confirmed by measuring the oxide film thickness with the ellipsometer.

Thus, even when the Embodiment 2 (S820) utilizing ozone gas as shown in FIG. 5 is adopted, because an oxide film equivalent to that formed in the Embodiment 1 (S810) utilizing ozone gas as shown in FIG. 3 is formed on the surface of the wafer 10, a significant reduction of processing time may be achieved while the wafer 10 produced by the Embodiment 1 may have as high quality as the wafer produced by the Comparative example (S1000) utilizing the ozone water as shown in FIG. 17.

FIGS. 11A and 11B illustrate a specification comparison between an AC servomotor to be used in the wafer processing apparatus 100 and an AC servomotor to be used in a conventional spin drying chamber. FIG. 11A shows tabulated specifications of the AC servomotor as comparative examples for the cases of the wafers having diameters of 200, 300, and 450 mm in the conventional spin drying chamber. The specifications of the AC servomotor to be used for, in particular, the 450-mm wafer 10 in the method according to the Embodiment 1 of the present invention are summarized as the embodiment. FIG. 11B is a semi-logarithmic graph illustrating these numerical values of FIG. 11A.

In a case of performing the spin drying, approximately 3000 rpm is required as a maximum rotational speed for drying. Although it is not necessary to provide so much power or torque when the diameter of the wafer 10 is 200 mm, the required power increases drastically and the torque also increases as the diameter increases to 300 and 450 mm. There is also a drastic increase in weight. Because the required maximum rotation speed is, however, 500 rpm in the case of the present embodiment, the so much power is not required. In regard to the torque, because the greatest torque is required at the beginning of rotation, a large difference between the comparative example and the example is not seen here. The motor to be used for the example can be lighter than that to be used for the comparative example using the wafer having even 200 mm diameter since the anti-vibration measure is not so required that the heavyweight motor is not necessary because the motor rotates at a low rotational speed. Also with the present embodiment, because the high-speed rotation is not so required as in the spin drying, even when the large-diameter wafer 10 is mounted on the mounting member, an outer peripheral portion thereof is not warped due to the centrifugal force.

As is clear from FIGS. 11A and 11B, it can be understood that the AC servomotor for the case of using the 450 mm wafer 10 in the wafer processing apparatus 100 according to the present invention can have lower requirement in the specification in any of the power, the rotational speed, and the weight as compared to that of the conventional spin drying chamber. Therefore, the size of the wafer processing apparatus 100 can smaller and the energy can be saved as well.

Figure 12A:
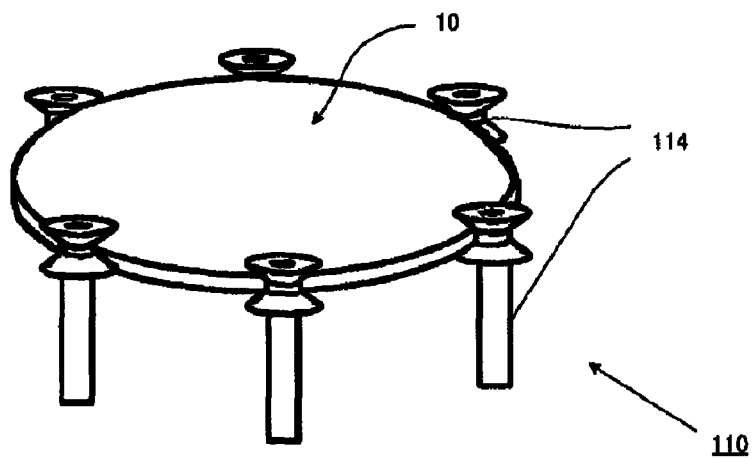
FIG. 12A is a perspective view showing schematically a mounting device.
Figure 12B:
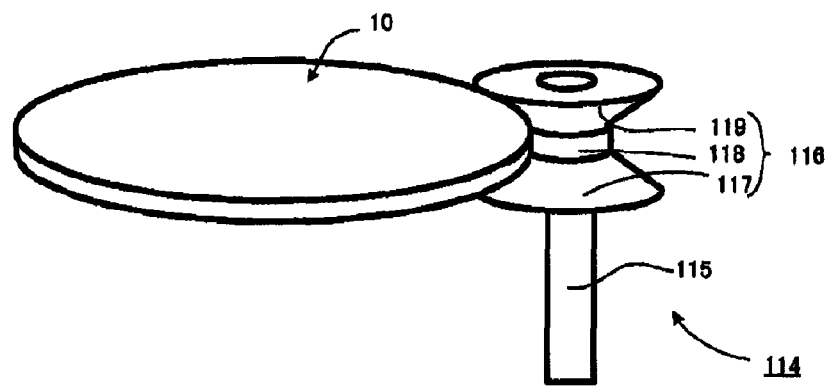
FIG. 12B is a partially enlarged perspective view showing schematically how one of mounting members of the mounting device holds the wafer.
Figure 12C:
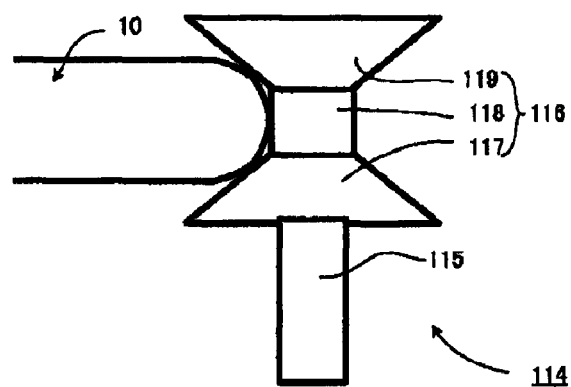
FIG. 12C is a partially enlarged side view showing schematically how one of mounting members of the mounting device holds the wafer.

FIGS. 12A to 12C show schematically a specific example of the mounting member 110 as described in the specification in reference to FIG. 1. FIG. 12A is a perspective view showing the whole mounting member 110 in a state where the wafer 10 is placed, FIG. 12B is a perspective view showing how one piece of the mounting member 110 supports the wafer 10 in an enlarged way by only showing one of six pins 114, and FIG. 12C is a partially enlarged front view of FIG. 12B. As shown in FIG. 12A, the pins 114 are disposed at six locations with equal intervals along an outer periphery of the wafer 10 that is placed substantially in horizontal. A bobbin-shaped piece (hereinafter to be referred as "bobbin") 116 is mounted to a top end of each rod 115, a circumferential edge of the wafer 10 is inserted in a recess 118 of the bobbin 116, and the wafer 10 is thereby held at the circumferential edge. Each of the six pins 114 is constituted of the bobbin 116 and a rod 115 as a main portion erected on a rotating member (not shown) and includes a height adjusting mechanism (not shown) so that a practically level surface can be realized by adjusting the respective bobbins 116.

The rotating member (not shown) is connected to a rotating shaft of an AC servo motor (not shown) and is made rotatable. As mentioned above, each pin 114 is constituted of the rod 115 erected substantially on the rotating member (not shown) and the bobbin 116. The bobbin 116 is constituted of a stopper portion 119 and a support portion 117 of respectively truncated conical shape that are disposed above and below thin part (seen like a recess in the front view) 118 (two truncated cones disposed across the thin part 118 to face each other). The lower support portion 117 has a tapered side surface that becomes thinner toward the upper side, and the upper stopper portion 119 has a tapered side surface that oppositely becomes thinner toward the lower side. In particular, the stopper portion 119 has a shaft hole at its center and is mounted detachably from the pin 114.

Figure 13A:
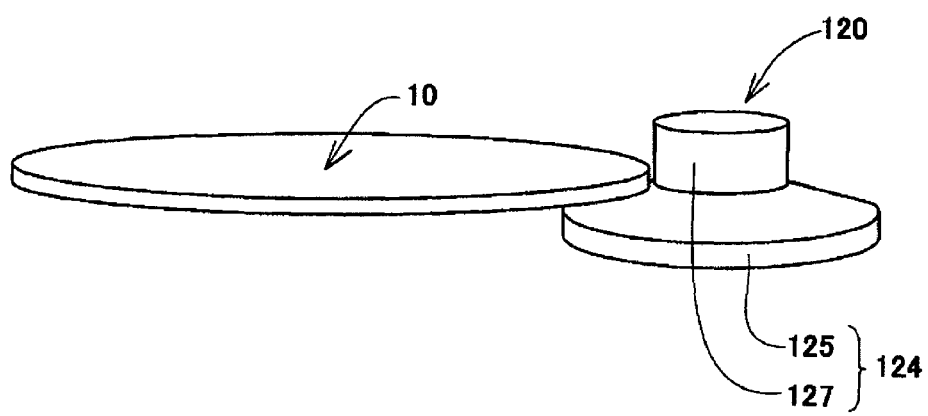
FIG. 13A is a perspective view showing schematically how another mounting device holds the wafer.
Figure 13B:
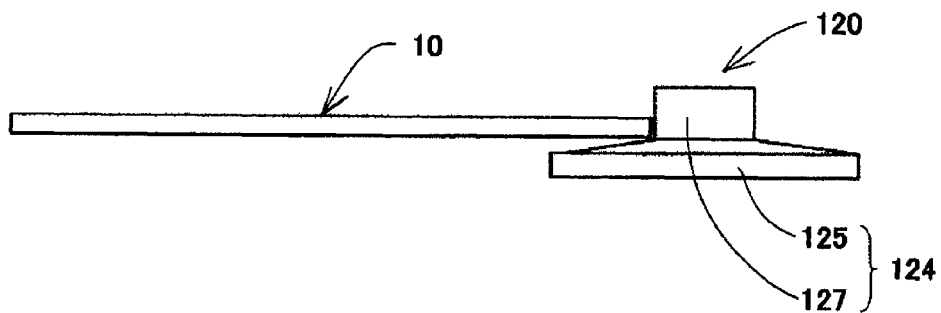
FIG. 13B is a side view showing schematically how the other mounting device holds the wafer.

FIGS. 13A and 13B show schematically how the wafer 10 is placed on another mounting member 120. FIG. 13A is a perspective view and FIG. 13B is a front view. The mounting member 120 holds the wafer 10 at a predetermined position from below. The mounting member 120 includes an abutment 125 of a truncated conical shape and a stopping portion 127 disposed on an upper surface of the abutment 125. A conical portion of the abutment 125 supports an edge portion (circumferential periphery) of the wafer 10 from below, and the stopping portion 127 stops a side surface of the wafer 10.

Figure 14A:
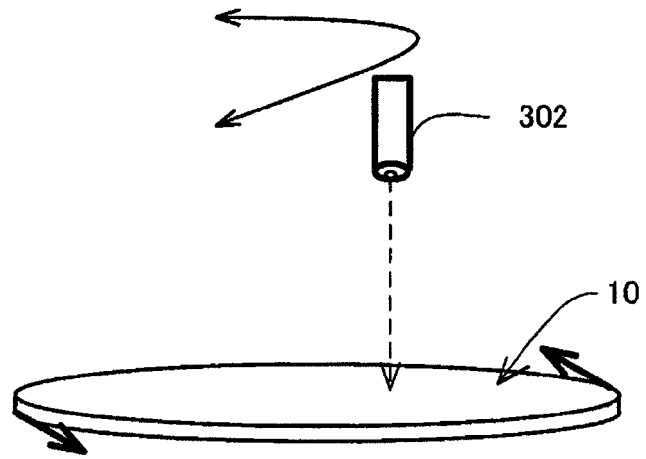
FIG. 14A is a perspective view showing schematically an example of a nozzle configuration.
Figure 14B:
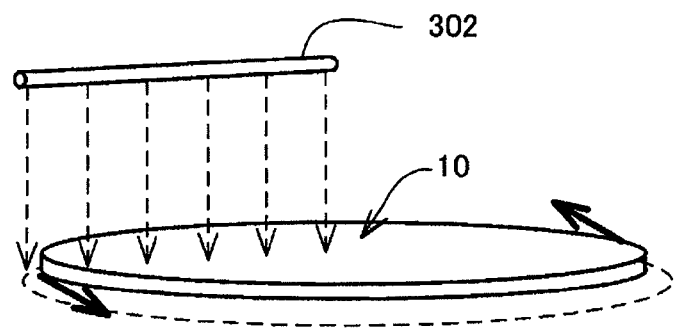
FIG. 14B is a perspective view showing schematically another example of another nozzle configuration.
Figure 14C:
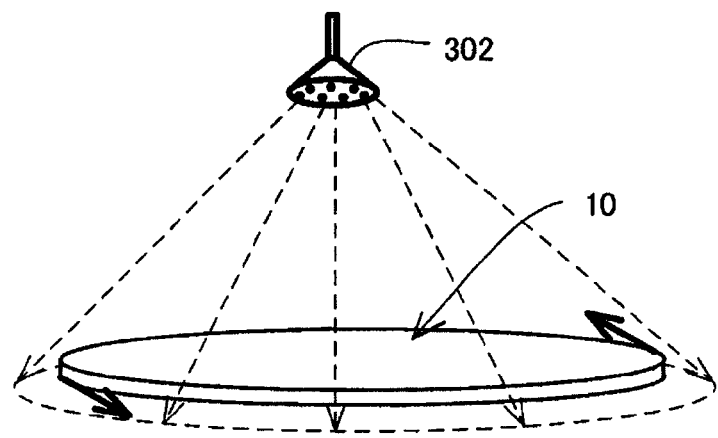
FIG. 14C is a perspective view showing schematically yet another example of yet another nozzle configuration.

FIGS. 14A to 14C show schematic views of specific examples of nozzles 302 and how liquid or gas is jetted onto the wafer 10. The nozzle 302 can correspond to any one of the nozzles 212u, 212d, 232u, 232d, 152u, 152d, 172u, 172d, 192u, 192d, 312u, and 312d as shown in FIG. 1 or 7. Here, just the one nozzle disposed above the wafer 10 is drawn and described. The nozzle 302 is not limited to the shapes shown in FIG. 14.

As shown in FIG. 14A, the nozzle 302 is a rectilinear pipe and is disposed above or below the wafer 10. With the nozzle 302, a front end of a hollow portion of a Φ 5 mm inner diameter is directed toward the wafer 10 side and configured as it is as a jetting outlet. Liquid or gas is jetted rectilinearly toward the wafer 10 from the jetting outlet. In this process, the nozzle 302 performs jetting while being swung in a predetermined direction in the vicinity of the surface. By thus jetting while swinging the pipe-type nozzle 302, the liquid or the gas can be distributed uniformly across the entire surface of the wafer 10. The nozzle 302 may be changed in the angle in which its front end is directed to jet the liquid or the gas across the entirety of the wafer 10. Or, the wafer 10 may be rotated during jetting.

As shown in FIG. 14B, the nozzle 302 has a crossbar-like form and is disposed above or below so that its longitudinal direction extends along a radius direction of the wafer 10. The nozzle 302 has a dimension longer than the radius of the wafer 10, and a plurality of small-diameter holes are opened in a row along the longitudinal direction and each hole facing toward the wafer 10. Liquid or gas is jetted rectilinearly toward the wafer 10 from these holes. When the wafer 10 is rotated in this process, the liquid or the gas is jetted successively onto the surface of the wafer 10 so as to draw circles along the radius. By thus making the nozzle 302 have a crossbar-like form, jetting the liquid or the gas from the holes disposed in the longitudinal direction, and rotating the wafer 10, the liquid or the gas can be distributed uniformly across the entire surface of the wafer 10. In a case where the gas is to be jetted using the crossbar type nozzle 302, the same effects can be provided by forming a slit in the longitudinal direction in place of forming the holes.

As shown in FIG. 14C, the nozzle 302 (with the exception of the nozzles 192u and 192d of the liquid removing gas jetting device 190) has a showerhead-like shape and is disposed above or below the wafer 10. A plurality of small-diameter holes are disposed at the wafer 10 side at a front end of each nozzle and a liquid or a gas is thereby enabled to be jetted or sprayed radially. By thus making the nozzle 302 have the showerhead shape and performing jetting or spraying radially from the holes, the liquid or the gas can be distributed uniformly across the entire surface of the wafer 10 even without performing the operation of swinging the nozzle 302 or the operation of rotating the wafer 10. In a case where the swinging operation or the rotation operation is combined with the jetting or spraying using the showerhead type nozzle 302, the liquid or the gas can be distributed more uniformly across the entire surface of the wafer 10.

Figure 15A:
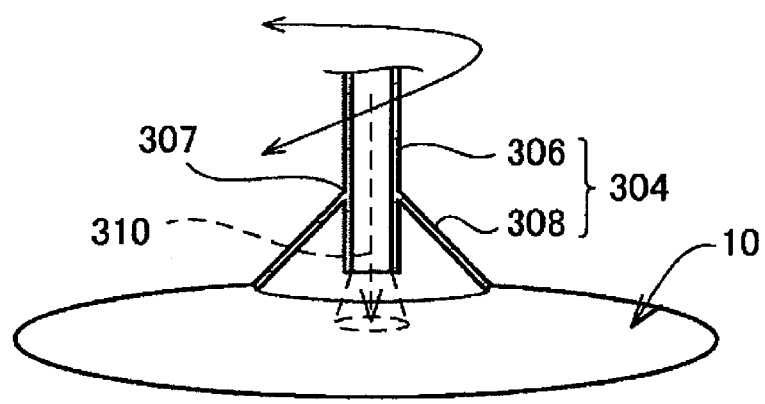
FIG. 15A is a schematic perspective view showing still another example of still another nozzle configuration.
Figure 15B:
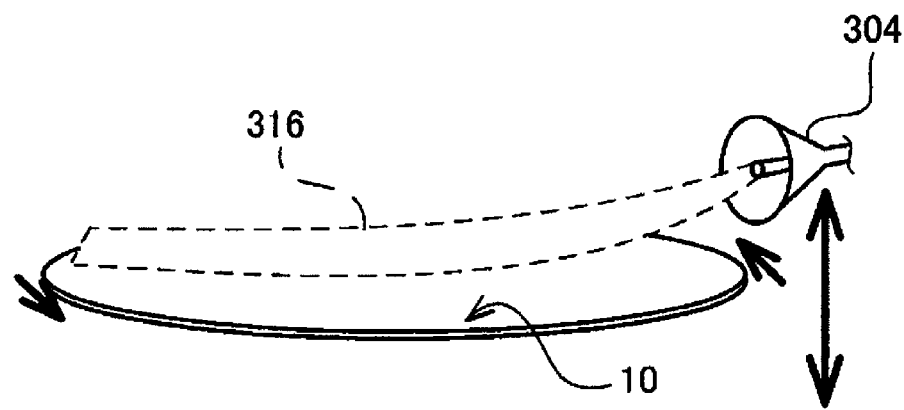
FIG. 15B is a schematic perspective view showing another example of another nozzle configuration.

FIGS. 15A and 15B are schematic diagrams showing other examples of nozzles with different shapes and configurations. FIG. 15A is a schematic view of an umbrella nozzle 304. The umbrella nozzle 304 is constituted of a rectilinear tube portion 306 and a bell-like umbrella portion 308, and a base of the umbrella portion 308 is connected and made integral to a connection portion 307 at an intermediate position near a front end of the tube portion 306. The tube portion 306 is a small-diameter tube, and the front end of a hollow portion of a Φ 5 mm inner diameter becomes a jetting outlet as it is and the liquid or the gas is jetted rectilinearly toward the wafer 10 therefrom. The umbrella portion 308 is a thin member that separatingly guards a periphery of the jetting outlet and extends in the front end direction while separating from an outer periphery of the connection portion 307 and spreading outward. A front end of the extended umbrella portion 308 protrudes beyond the front end of the tube portion 306. The nozzle 304 is disposed above or below the wafer 10, and is swung in a predetermined direction in a vicinity of the surface of the wafer 10 when the liquid or gas is jetted from the jetting outlet.

FIG. 15B is a schematic view of an example where the umbrella nozzle 304 is disposed at a side of the wafer 10. The umbrella nozzle 304 is disposed at the side of the wafer 10 with the jetting outlet being directed toward the wafer 10. A jetted substance 316 from such an umbrella nozzle 304 is jetted along the wafer 10 surface. By making the umbrella nozzle 304 disposed at the side of the wafer 10 movable above and below the wafer 10 as indicated by arrows in the figure, a structure in common of the nozzle 304 can be realized easily for the upper and lower sides of the wafer 10.

Figure 16A:
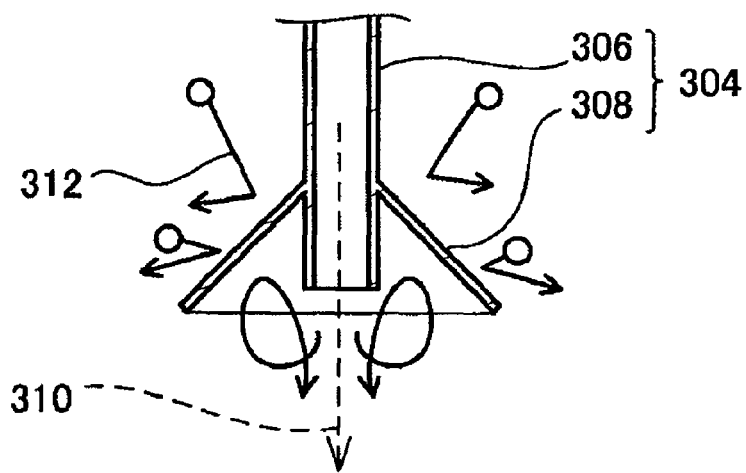
FIG. 16A is a schematic section view showing schematically a mechanism of nozzle injection of the nozzle example of FIG. 15A.
Figure 16B:
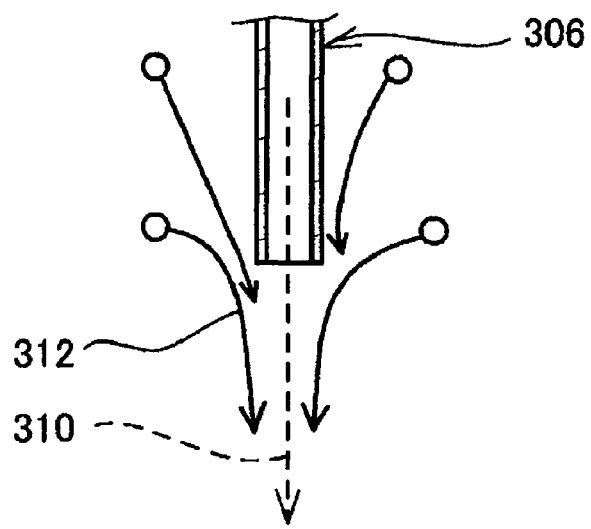
FIG. 16B is a schematic section view showing schematically another mechanism of nozzle injection of another nozzle example.

FIGS. 16A and 16B show schematic diagrams of jetting mechanisms of different nozzles. FIG. 16A is a diagram showing a manner of jetting from the umbrella nozzle 304. FIG. 16B is a diagram showing a manner of jetting from the rectilinear tube portion 306 without the umbrella portion 308. First, the manner of jetting from the tube portion 306 without the umbrella portion 308 shall be described according to FIG. 16B. From the tube portion 306, the liquid or the gas 310 is jetted vigorously and rectilinearly toward the wafer 10. In accordance with the vigor of the jetting, air (not shown) in a vicinity of the jetting outlet of the tube portion 306 becomes entrained in the jetted liquid or gas 310. The entrained air is jetted along with the jetted substance 310 onto the wafer 10. In this process, a few particles 312 in the entrained air may become jetted together. Also, because the vicinity of the jetting outlet is put in a negative pressure state due to entrainment of the air (not shown), a flow of air (not shown) occurs by which ambient air flows toward the jetting outlet. A flow of air thus occurs without interruption while jetting from the tube portion 306 is taking place, and the ambient air (not shown) continues to be jetted onto the wafer 10 along with the jetted liquid or gas 310. The few particles 312 suspended in the air in the processing environment of the wafer 10 may thus be collected and jetted together, and there is possibility for more particles 312 than that which becomes attached due to freefall to become attached to the surface of the wafer 10. Because there is also a possibility for the particles 312 to become entrained and blown on vigorously, there is a possibility of making the particles 312 become more strongly deposited on the wafer 10 surface than in the case of attachment due to freefall or a possibility of flawing the wafer 10 surface. On the other hand, as shown in FIG. 16A, in the case where the liquid or the gas 310 is jetted using the umbrella nozzle 304, the flow of air in the vicinity of the jetting outlet is blocked by the umbrella portion 308 and it is unlikely for the air in the processing environment as a whole from becoming entrained and being jetted together, and thereby the particles 312 are not collected and made to become attached onto the wafer 10. Because the umbrella nozzle 304 thus does not jet the ambient air, attachment of the few particles 312 in the air can be prevented and the wafer 10 of high surface cleanliness can be obtained in each processing step.

As the nozzles 302, for example, nozzles of tubular type, crossbar type, shower head type, umbrella type, and other various shapes may be combined as appropriate. That is, the nozzles shapes may differ according to each jetting device 210, 230, 150, 170, 190, etc., and according to being disposed above, below, or at a side of the wafer 10.

Because the wafer processing apparatus 100 is configured to jet either or both of the liquid and the gas onto the same wafer 10 using a plurality of the nozzles 302, use of one nozzle 302 in common simplifies the structure and helps reduce cost. A structure may thus be configured where all or a portion the nozzles 302 are connected in a shared manner to jet or spray the liquid or gas.

In addition, the following is also provided.

The spin drying that is performed to dry the surface finally is gradually getting more difficult, as semiconductor wafers become larger in diameter. In the spin drying, liquid, which may include water, on the surface is removed by the centrifugal force, and a centrifugal force difference between near the center and near a periphery becomes larger as the centrifugal force increases in proportion to a distance r from the center for the same angular speed while a semiconductor wafer is getting larger in diameter. If the centrifugal force near the center is kept the same, the centrifugal force near the periphery becomes so large, and it is concerned that deformation of the semiconductor wafer may be caused by the spin drying. For example, whereas the speed at an outer periphery is approximately 30 m/s when a semiconductor wafer of a 200-mm diameter is rotated at 3000 rpm, the speed at the outer periphery is approximately 50 m/s in the case of the semiconductor wafer having a 300-mm diameter. Furthermore, the speed becomes approximately 70 m/s in the case of the semiconductor wafer having a 450-mm diameter. Thus, unfavorable vibration may also be caused as well unless the outer peripheral edge is balanced well. Also, an acceleration torque increases with the spin drying apparatus that retains a predetermined rotation speed within a predetermined period of time because a rotational moment may increases with an increase of the rotational radius. Thus, it is getting difficult to avoid the size increase of the apparatus itself by increasing a motor capacity, etc. Furthermore, productivity may not be improved because the spin drying is not short in the time taken. The taken time may be referred to as "takt" time.

It is possible to reduce the takt time and simplify the processes by utilizing the surface state of the semiconductor wafer such that the reduction of the cost for the production facilities may be achieved.

In the above-described embodiments, a processing method for a semiconductor wafer is provided, wherein the method may comprise: a water repellent step of making a surface of a semiconductor wafer water-repellent; and a hydrophilic step of making the surface hydrophilic by oxidizing the surface. Here, the semiconductor wafer may include a silicon wafer. The surface may include a top (or front) surface and/or a bottom (or rear) surface (hereinafter collectively referred to as "surface"). The water repellent processing to the surface may include removal of an oxide film on the surface of the semiconductor wafer. A wetting or moistening step may be included in or before the abovementioned hydrophilic step. The oxidizing gas may include an oxygen-containing gas, water-vapor-containing gas, and other gases capable of oxidizing the surface of the semiconductor wafer. The oxidizing may include not just forming of an oxide but also taking away of electrons from the surface or increasing a valence number of a surface element as a result of interaction with a surface substance. After the hydrophilic step, the surface of the semiconductor wafer may be dry.

In the present embodiment, a processing method of a semiconductor wafer comprising the steps of: a water repellent step; a liquid removing step; and a hydrophilic step in this order is provided. The water repellent step may include removing at least part of an oxide film from the surface of the semiconductor wafer. The liquid removing step may include removing the liquid from the surface. Then, the hydrophilic step may include providing at least partial oxide film on the surface by applying an oxidizing gas. Here, a gas flow of the oxidizing gas and/or an ambient gas involved by the oxidizing gas is characterized by an unsaturated vapor pressure of the liquid such that the liquid on the surface vaporizes. And the above-described steps may be conducted in this order (or sequence).

Here, a degree of water repellency may be determined by measuring a contact angle of liquid (such as water) on the surface. It can be defined that the surface is water-repellent if the contact angle is 12 or higher degrees, it is more preferable to define the water repellency by the contact angle to be 32 or higher degrees in considering that this method can be more effective. Furthermore, it is considered that the liquid repelling effect of the surface of semiconductor wafer can be very high when the contact angle is 65 or higher degrees where the liquid may include water. Such an effect at a microscopic size is extremely important in terms of drying of the semiconductor wafer. This is because a normal vaporization rate of such liquid, which may include water, is extremely low although vaporization of the liquid, which may include water, is the final step of drying, which is not necessarily easy in terms of liquid removal from a macroscopic viewpoint. In the case where the semiconductor wafer is a silicon wafer, the oxide film is silicon oxide and exhibits hydrophilicity. Meanwhile, when this oxide film is removed and metal silicon is exposed on the surface, water repellency is exhibited. Imparting of water repellency or hydrophilization can thus be achieved by removing or imparting at least a portion of the oxide film. Although the liquid on the surface, which may include water, would be easily removed when water repellency is imparted, it is not necessarily easy to remove the liquid from the surface of the semiconductor wafer merely by providing the water repellency. Even though water repellency imparted on some portion of the surface causes liquid to move out of the location to an adjacent portion because the liquid is repelled from the original location, both portions may become in the same state once the adjacent portion is also imparted with water repellency such that the liquid is still left on the surface of the semiconductor wafer in the end. The abovementioned liquid removing step may include removal of the liquid on the surface of a horizontally held semiconductor wafer by use of gravity, centrifugal force, wind force, etc.

The oxidizing gas may include an ozone gas, a hydrogen peroxide gas, or a mixture thereof. Furthermore, an inert gas (for example, an argon gas or a nitrogen gas) may be included, and these may furthermore include water vapor (pure water). When in the final processing, the surface is made hydrophilic by the oxidizing gas, it is considered preferable for the hydrophilic film to have a thickness of at least 4.0 Å as a protective film. To obtain a better coating property, it is furthermore considered preferable for the thickness to be at least 5.0 Å. However, if the film is made too thick, the subsequent step of removing the hydrophilic film in general may encounter difficulty so that it is considered preferable for the thickness of the hydrophilic film to be not exceeding approximately 60 Å. However, if it is actually not so difficult to remove the hydrophilic film, the film thickness may be equal to or greater than this. Here, a degree of hydrophilization can be determined by measuring the contact angle, for example, of water on the surface. The contact angle is preferably not exceeding 12 degrees and more preferably not exceeding 3 degrees. The abovementioned oxidizing gas flow may include, for example, a gas flow jetted from a nozzle. The gas flow may entrain an ambient gas (maybe including nitrogen or other inert gas, atmospheric air, etc., for example) and be jetted together with the ambient gas onto the surface of the semiconductor wafer. That such ambient gas and/or jetted gas flow has an unsaturated vapor pressure may mean that the gas flow does not contain a vapor pressure of the liquid at the saturated level in the temperature. That is, such ambient gas and/or jetted gas flow can support a further amount of the vapor of the liquid.

In the above embodiment, the processing method is characterized in that the semiconductor wafer is a silicon wafer.

Here, "at least a portion" is a concept that includes the entirety and concerns either or both of a front surface and a rear surface. The water repellency imparting step (i.e., water repellent step) may include imparting of water repellency to at least a portion of the semiconductor wafer surface or may include removing of at least a portion of an oxide film. The water repellency imparting step may include removal of a contaminant in accompaniment with removal of such an oxide film. On the other hand, the hydrophilizing step (i.e., hydrophilic step) may include imparting an oxide film to at least a portion of the surface of the semiconductor wafer. The semiconductor wafer can be protected by such an oxide film.

In the above embodiments, the processing method is characterized in that the step of removing the at least part of oxide film from the surface comprises bringing the liquid into directly contact with the surface.

Here, the wetting step may be a step in which water or an aqueous solution, etc., is mainly used. "Before the hydrophilizing step" signifies that the hydrophilizing step is a step to be performed finally (except the case where another hydrophilizing step is performed after the hydrophilizing step) and there is no need to include a drying step thereafter. With the wetting step, a subsequent drying step is desired. In particular, a combination of a fluid that is not dried readily and a semiconductor wafer surface having a property of repelling such a fluid is also effective.

In the above embodiments of the processing methods, the step of removing the at least part of oxide film from the surface is characterized by using aqueous hydrofluoric acid and/or hydrogen fluoride gas.

The water repellency imparting step may include a step in which an aqueous hydrofluoric acid and/or hydrogen fluoride gas removes hydrophilic silicon dioxide formed on the semiconductor wafer surface. Here, a formula of a chemical reaction occurring on the surface of the semiconductor wafer with the aqueous hydrofluoric acid is considered to be as follows:

$$6HF+SiO_2 \rightarrow H_2SiF_6+2H_2O.$$

That is, the silicon dioxide can be removed as the aqueous hydrofluoric acid reacts with the silicon dioxide on the surface to generate hexafluorosilicic acid and water. Since the hexafluorosilicic acid is in a liquid phase at the room temperature and dissolves readily in water, it is considered to be removed at the same time by removal of the aqueous solution, etc. A formula of a chemical reaction occurring on the surface of the semiconductor wafer with the hydrogen fluoride gas is considered to be as follows:

$$4HF+SiO_2 \rightarrow SiF_4+2H_2O$$

More specifically, the following formulae are considered to apply.

$$HF+H_2O \rightarrow H_3O^++HF_2^- \qquad a.$$

$$H_3O^++HF_2^-+SiO_2 \rightarrow SiF_4+4H_2O \qquad b.$$

That is, as the hydrogen fluoride gas reacts with the silicon dioxide on the surface to generate silicon tetrafluoride and water, the silicon dioxide can be removed. Since the silicon tetrafluoride is in a gas phase at normal temperature, it disperses in air, and a large portion of the water generated is considered to evaporate. By such a reaction mechanism of aqueous hydrofluoric acid or hydrogen chloride gas, the water-repellent silicon metal becomes exposed and the semiconductor wafer surface becomes water-repellent.

The aqueous hydrofluoric acid may include, for example, ammonium fluoride ($NH_4F$), etc., dissolved in a buffer. The hydrogen fluoride gas may include a water-vapor-containing gas or a hydrofluoric-acid-containing gas obtained by bubbling nitrogen through aqueous hydrofluoric acid and may include gases diluted by other buffer gases.

In the water repellency imparting step, a liquid removing gas may be used along with or after using aqueous hydrofluoric acid or hydrogen fluoride gas to perform the liquid removal more rapidly. Here, the liquid removing gas may be supplied without supplying a processing agent that includes water or other liquid. Such a gas may include an inert gas, nitrogen gas, or an organic gas of 0 to 100%. The organic gas may include IPA (isopropyl alcohol) gas. Here, the liquid may include moisture, and furthermore the liquid may include water, an aqueous solution, a water-soluble liquid, a water-compatible liquid, etc.

In the above embodiments of the processing method, the step of removing liquid from the surface comprises rotating the semiconductor wafer at a rotational speed of not exceeding 1500 rpm.

Here, the rotation of the semiconductor wafer is not exceeding 1500 rpm, more preferably not exceeding 500 rpm, and even more preferably not exceeding 300 rpm. In particular, a rotation speed in a range in which vibration does not increase in accompaniment with rotation is preferable and especially a rotation speed in a range in which a problem does not occur in fixing of the semiconductor wafer is preferable.

Holding the semiconductor wafer rotation speed low in this manner is especially effective for a semiconductor wafer with a diameter of at least 300 mm. Furthermore, this becomes more effective when the diameter is at least 450 mm. This is because as mentioned above, at the same rotation speed, the centrifugal force increases in proportion to the diameter and the difference between the centrifugal force near the center and the centrifugal force near the circumferential edge increases. Thus, near the circumferential edge, internal stress and strain due to the centrifugal force etc., may influence characteristics of the semiconductor wafer, and accommodation of vibration due to rotation of a thin semiconductor wafer becomes difficult.

In the above embodiments of the processing method, the step of removing liquid from the surface comprises tilting the semiconductor wafer.

The liquid removing step (also referred to as "pre-drying") is effective when a liquid is used in the water repellency imparting step or the hydrophilizing step and when performed when the semiconductor wafer surface is in a wet state. The liquid removing step may include using wind force and surface tension to blow off waterdrops, etc., on the semiconductor wafer surface by jetting of the liquid removing gas, and just blowing by jetting of the liquid removing gas may be performed without inclining the semiconductor wafer. The liquid removing step thus preferably includes a method that does not depend on the rotation speed of the semiconductor wafer. This is because there is a case where the semiconductor wafer is rotated to obtain uniformity in processing the semiconductor wafer, and by combining methods that differ in property, the methods can be made to compensate each other. The liquid removing gas may include an inert gas, nitrogen gas, or an organic gas of 0 to 100%. The organic gas may include IPA (isopropyl alcohol) gas.

The jetting of the liquid removing gas may be performed by a nozzle equipped so as to oppose an upper surface of the semiconductor wafer at a substantially central position of the semiconductor wafer. By this liquid removing gas jetting step, liquid removal can be performed easily on a central portion of the semiconductor wafer. The liquid removing step may also include using centrifugal force to effectively remove water droplets near the semiconductor wafer circumferential edge. By this step, in the case of a large-diameter semiconductor wafer, the liquid at the semiconductor wafer circumferential edge can be removed easily even at a low rotational speed. The liquid removing step may include a semiconductor wafer inclining step of using gravity to perform liquid removal. The liquid removing step thus enables the liquid (maybe including water) on the semiconductor wafer surface to be removed by using wind force, centrifugal force, or gravity, and the methods may be used singularly or in combination in accordance with the respective characteristics of the forces used.

In the above embodiments, an apparatus for cleaning a semiconductor wafer is provided. The apparatus comprises: a supplier (or supplying means) which supplies a processing fluid for water-repellency (or a processing gas for water-repellency) that is capable of removing a hydrophilic film on a surface of the semiconductor wafer; a supplier (or supplying means) which supplies a processing gas for hydrophilicity that is capable of changing water-repellency of the surface exposed after removal of the hydrophilic film into hydrophilicity; and a rotator (or rotation means) capable of rotating the semiconductor wafer at a rotation speed not exceeding 1500 rpm during the removal of the hydrophilic film. Here, the rotator is controlled to rotate the semiconductor wafer at a predetermined rotation speed when or after the processing fluid for water-repellency is supplied onto the semiconductor wafer.

Here, the hydrophilic film may include an oxide film. An oxide film is generally high in wetting property with respect to water. The water repellency processing fluid may include aqueous hydrofluoric acid, hydrogen fluoride gas, or a compound or mixture related thereto. In particular, a fluid by which an oxide film (for example, a silicon oxide film) that is formed readily on a surface of a silicon wafer can be removed from the surface by dissolution, decomposition, etc., is preferable. The water repellency processing fluid does not have to be a liquid, and, for example, may be a gas. Or the water repellency processing fluid may be a mixture of a liquid and a gas.

In the above embodiments, the semiconductor wafer is a silicon wafer.

Furthermore, a means for supplying a processing liquid that cleans the surface of the semiconductor wafer may be included. The processing liquid that cleans the semiconductor wafer surface may include water, an aqueous solution, pure water, and ultrapure water. To prevent contaminants, pure water or ultrapure water is more preferable. The means for supplying the water repellency processing gas, the means for supplying the hydrophilicity processing gas, and the means for supplying the processing liquid that cleans the surface may include the processing liquid and the processing gas.

In the above embodiments, the apparatus further comprising: a liquid remover which removes liquid on the surface of the semiconductor wafer is provided.

A holding device capable of rotating the semiconductor wafer at a predetermined speed while holding it may include, for example, a rotating table on which the semiconductor wafer can be placed. A device capable of chucking the semiconductor wafer by clamping a circumferential edge portion thereof may also be included. The predetermined speed may be a fixed rotation speed or a variable rotation speed. A maximum rotation speed (for example, 1500 rpm) is preferably determined in advance because stress at the circumferential edge increases at a high speed. Changing of speed is preferably controlled so that torque characteristics of a drive device and a stress inside the semiconductor wafer that is the rotated object do not become unnecessarily large. A nozzle, disposed in a manner enabling supplying of the water repellency processing fluid or the water repellency processing gas or the hydrophilicity processing gas onto the surface of the semiconductor wafer, may have an opening from which the liquid or gas is ejected. The liquid or gas may be jetted directly toward the surface of the semiconductor wafer from the opening or may be supplied indirectly, for example, via reflection or another pathway. An air blowing device may include the nozzle and the nozzle may function as the air blowing device that blows the liquid on the semiconductor wafer surface.

Here, the means for supplying the water repellency processing gas may include a nozzle disposed in a manner enabling supplying of the water repellency processing fluid or the water repellency processing gas that is capable of removing the hydrophilic film on the surface of the semiconductor wafer held by the holding device. Or, the means for supplying the hydrophilicity processing gas may include a nozzle disposed in a manner enabling supplying of the hydrophilicity processing gas that can change the water-repellent surface, appearing after removal of the hydrophilic film, of the semiconductor wafer held by the holding device to the hydrophilic state. The rotation means capable of rotating the semiconductor wafer not exceeding 1500 rpm may include a controller that controls a rotation device to rotate the semiconductor wafer at the predetermined speed.

The rotation means may be constituted as a liquid removing means. The liquid removing means may include an air blowing device. A wafer inclining means may also be included. Thus, the liquid removing means removes the liquid (maybe including water) on the semiconductor wafer surface by use of centrifugal force, wind force, gravity etc. The air blowing means may use wind force and blow off water droplets, etc., on the semiconductor wafer surface by a means for jetting a liquid removing gas. The liquid removing gas may include an inert gas, a nitrogen gas, or an organic gas of 0 to 100%. The organic gas may include an IPA (isopropyl alcohol) gas. The liquid removing gas jetting means may be configured of a nozzle equipped so as to oppose the upper surface of the semiconductor wafer at a substantially central position of the semiconductor wafer. By this liquid removing gas jetting means, liquid removal can be performed easily on the central portion of the semiconductor wafer. The semiconductor wafer rotation means can rotate the semiconductor wafer so as to move water droplets, etc., on the semiconductor wafer surface by use of centrifugal force. The rotation means can perform control to rotate the semiconductor wafer at the predetermined speed. By this means, in the case of a large-diameter semiconductor wafer, the liquid at the semiconductor wafer circumferential edge can be removed readily even at a low rotation speed. Because the centrifugal force is not very effective at the central portion, water droplets at the central portion may be moved close to the circumferential edge by the abovementioned liquid removing gas jetting means. The wafer inclining means can perform liquid removal by use of gravity.

As mentioned above, an apparatus for cleaning a plurality of semiconductor wafers is provided. The apparatus comprises: a supplier which supplies a processing fluid for water-repellency capable of removing a hydrophilic film on a surface of each semiconductor wafer; a supplier which supplies a processing gas for hydrophilicity capable of changing water-repellency of the surface exposed after removal of the hydrophilic film to hydrophilicity; and an enclosure capable of housing the plurality of semiconductor wafers.

With the present invention, a step of jetting either or both of an oxide film removing fluid and an oxide film removing gas onto a semiconductor wafer surface having a hydrophilic film to change the surface of the semiconductor wafer into a water-repellent state (S10) and a step of jetting an oxidizing gas onto the surface of the semiconductor wafer to form a hydrophilic film (S40) are included. In a case of jetting the oxidizing gas, the semiconductor wafer is rotated at a rotation speed of not exceeding 1500 rpm. Thus, in the processing method for the semiconductor wafer, a spin drying step can be omitted. Therefore, deformation of the semiconductor wafer due to centrifugal force can be effectively eliminated as the semiconductor wafer does not have to be rotated at a high speed, and the apparatus as a whole can be simplified since a device for rotation can also be changed to a simple device. Also, reduction of processing time and high throughput can be realized since it is no necessary to use a chamber that is used for the spin drying. Also, the possibility of deposition of particles on the semiconductor wafer can also be lessened as gas flow turbulence caused by rotation of the semiconductor wafer may be suppressed.

What is claimed is:

1. A processing method of a semiconductor wafer comprising the steps of:
    setting the semiconductor wafer horizontally;
    removing at least part of an oxide film from a surface of the semiconductor wafer by applying hydrogen fluoride gas to the semiconductor wafer while the semiconductor wafer is rotated such that the surface becomes water repellant such that a contact angle of water becomes at least 32 degrees, the hydrogen fluoride gas made by bubbling nitrogen gas into aqueous hydrofluoric acid and collecting a gas phase from the bubbled aqueous hydrofluoric acid;
    removing a portion of water from the surface by stopping application of the hydrogen fluoride gas while the semiconductor wafer is continuously rotated at less than 500 rpm; and
    forming at least a partial oxide film on the surface by applying oxidizing gas such that the surface becomes so hydrophilic that a contact angle of water becomes not exceeding 12 degrees wherein a gas flow of the oxidizing gas is characterized by an unsaturated vapor pressure such that remaining water on the surface of the semiconductor wafer vaporizes,
    wherein the above steps are conducted in this order and the step of forming at least said partial oxide film is a final step of the processing method.

2. The processing method according to claim 1, wherein the semiconductor wafer is a silicon wafer.

3. The processing method according to claim 1, wherein:
    the step of removing at least part of said oxide film is characterized in that remaining water forms a spherical shape on the surface due to a water repellent property; and
    the step of removing said water is characterized in that the spherical shape of water is moved on the surface by centrifugal force caused by rotation of the semiconductor wafer.

4. The processing method according to claim 3, wherein the step of removing said water comprises jetting a liquid removing gas from a nozzle configured to oppose the surface of the semiconductor wafer at a substantially central position of the semiconductor wafer such that the spherical shape of water is moved toward a circumferential edge of the semiconductor wafer.

5. The processing method according to claim 3, wherein the semiconductor wafer is rotated at a rotational speed of not exceeding 300 rpm in the step of removing said water.

6. The processing method according to claim 1, wherein the oxidizing gas in the step of forming the at least the partial oxide film on the surface contains carbon dioxide.

* * * * *

UNITED STATES PATENT AND TRADEMARK OFFICE
CERTIFICATE OF CORRECTION

PATENT NO. : 8,334,222 B2
APPLICATION NO. : 12/434276
DATED : December 18, 2012
INVENTOR(S) : Gotou et al.

It is certified that error appears in the above-identified patent and that said Letters Patent is hereby corrected as shown below:

In the Specifications:

Column 2
Line 2, "S110" should read --S1010--

Column 2
Line 4, "S110" should read --S1010--

Signed and Sealed this
Fourteenth Day of May, 2013

Teresa Stanek Rea
*Acting Director of the United States Patent and Trademark Office*